United States Patent
Son et al.

(10) Patent No.: US 8,728,893 B2
(45) Date of Patent: *May 20, 2014

(54) METHOD OF FABRICATING A THREE-DIMENTIONAL SEMICONDUCTOR MEMORY DEVICE

(71) Applicant: Samsung Electronics Co., Ltd., Suwon-si (KR)

(72) Inventors: Byoungkeun Son, Suwon-si (KR); Jinho Kim, Hwaseong-si (KR); Hansoo Kim, Suwon-si (KR); Wonjun Lee, Seoul (KR); Daehyun Jang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/775,453

(22) Filed: Feb. 25, 2013

(65) Prior Publication Data

US 2013/0164894 A1    Jun. 27, 2013

Related U.S. Application Data

(63) Continuation of application No. 12/662,187, filed on Apr. 5, 2010, now Pat. No. 8,383,482.

(30) Foreign Application Priority Data

Sep. 29, 2009    (KR) .................. 10-2009-0092452

(51) Int. Cl.
   *H01L 21/336*    (2006.01)
(52) U.S. Cl.
   USPC .................. 438/279; 257/E21.645

(58) Field of Classification Search
   USPC .................. 257/E21.645; 438/279
   See application file for complete search history.

(56) References Cited

U.S. PATENT DOCUMENTS 8,383,482 B2 *   2/2013   Kim et al. .............. 438/279
(Continued)

FOREIGN PATENT DOCUMENTS

CN    101165919 A    4/2008
(Continued)

*Primary Examiner* — Marvin Payen
(74) *Attorney, Agent, or Firm* — Lee & Morse, P.C.

(57) ABSTRACT

A method of fabricating a semiconductor memory device includes alternately and repeatedly stacking sacrificial layers and insulating layers on a substrate, forming an active pattern penetrating the sacrificial layers and the insulating layers, continuously patterning the insulating layers and the sacrificial layers to form a trench, removing the sacrificial layers exposed in the trench to form recess regions exposing a sidewall of the active pattern, forming an information storage layer on the substrate, forming a gate conductive layer on the information storage layer, such that the gate conductive layer fills the recess regions and defines an empty region in the trench, the empty region being surrounded by the gate conductive layer, and performing an isotropic etch process with respect to the gate conductive layer to form gate electrodes in the recess regions, such that the gate electrodes are separated from each other.

13 Claims, 19 Drawing Sheets

(56) References Cited

U.S. PATENT DOCUMENTS

| | | |
|---|---|---|
| 2007/0158736 A1 | 7/2007 | Arai et al. |
| 2008/0073635 A1 | 3/2008 | Kiyotoshi et al. |
| 2008/0094917 A1 | 4/2008 | Park et al. |
| 2008/0123390 A1 | 5/2008 | Kim et al. |
| 2008/0173928 A1 | 7/2008 | Arai et al. |
| 2009/0065941 A1 | 3/2009 | La Tulipe, Jr. et al. |
| 2009/0121271 A1 | 5/2009 | Son et al. |
| 2009/0242966 A1 | 10/2009 | Son et al. |
| 2012/0028450 A1 | 2/2012 | Son et al. |
| 2013/0065381 A1 | 3/2013 | Son et al. |

FOREIGN PATENT DOCUMENTS

| | | |
|---|---|---|
| JP | 10-093083 A | 4/1998 |
| JP | 2007-180389 A | 7/2007 |
| JP | 2007-317874 A | 12/2007 |
| JP | 2008-078404 A | 4/2008 |
| JP | 2008-159699 A | 7/2008 |
| JP | 2008-171838 A | 7/2008 |
| KR | 10-2008-0048314 A | 6/2008 |
| KR | 10-2008-0058251 A | 6/2008 |
| KR | 10-2009-0047614 A | 5/2009 |
| KR | 10-2009-0093770 A | 9/2009 |

\* cited by examiner

METHOD OF FABRICATING A THREE-DIMENTIONAL SEMICONDUCTOR MEMORY DEVICE

CROSS REFERENCE TO RELATED APPLICATION

This is a continuation application based on pending application Ser. No. 12/662,187, filed Apr. 5, 2010, the entire contents of which is hereby incorporated by reference.

BACKGROUND

1. Field

The present disclosure herein relates to a semiconductor device and a method of fabricating the same, and more particularly, to a three-dimensional semiconductor memory device and a method for fabricating the same.

2. Description of the Related Art

As the electronic industry has advanced to a high level, integration density of semiconductor devices has increased. Higher integration density of semiconductor devices is an important factor in determining product price. In other words, as integration density of semiconductor devices increases, product prices of semiconductor devices may decrease. Accordingly, a requirement for higher integration density of semiconductor devices is increasing. Typically, since integration density of semiconductor devices is mainly determined by an area occupied by a unit memory cell, integration may be greatly influenced by a degree of pattern miniaturization, i.e., a level of fine pattern forming technology. However, pattern miniaturization may be limited due to extremely expensive semiconductor equipments and/or difficulties in semiconductor fabrication processes.

To overcome such a limitation, there have been recently proposed three-dimensional semiconductor memory devices. However, conventional three-dimensional semiconductor memory devices may require unstable processing and/or may exhibit low product reliability.

SUMMARY

Embodiments are therefore directed to a three-dimensional semiconductor memory device and a method for fabricating the same, which substantially overcome one or more of the problems due to the limitations and disadvantages of the related art.

It is therefore a feature of an embodiment to provide a three-dimensional semiconductor memory device optimized for higher integration It is therefore another feature of an embodiment to provide a three-dimensional semiconductor memory device with superior reliability.

It is yet another feature of an embodiment to provide a three-dimensional semiconductor memory device that can enhance a process margin in a fabricating process.

It is still another feature of an embodiment to provide a method of fabricating a three-dimensional semiconductor memory device having one or more of the above features.

At least one of the above and other features and advantages may be realized by providing methods of fabricating a semiconductor device, including alternately and repeatedly stacking sacrificial layers and insulating layers on a substrate, forming an active pattern penetrating the sacrificial layers and the insulating layers, continuously patterning the insulating layers and the sacrificial layers to form a trench, removing the sacrificial layers exposed in the trench to form recess regions exposing a sidewall of the active pattern, forming an information storage layer on the substrate, forming a gate conductive layer filling the recess regions on the substrate having the information storage layer such that an empty region surrounded by the gate conductive layer is defined in the trench, and performing an isotropic etch process with respect to the gate conductive layer having the empty region to form gate electrodes, which are respectively disposed in the recess regions and are separated from each other.

In some embodiments, a bottom surface of the empty region may be comprised of the gate conductive layer, and the bottom surface of the empty region may be lower than a top surface of a portion of the gate conductive layer filling the lowermost recess region among the recess regions.

In other embodiments, sidewalls of the gate electrodes adjacent to the trench may be recessed further laterally than sidewalls of the patterned insulating layers adjacent to the trench by the isotropic etch process.

In still other embodiments, the above method may further include forming a device isolation pattern filling the trench and portions of the recess regions neighboring to the gate electrodes.

In even embodiments, the trench may be formed with an oblique sidewall, and a width of a lower end of the trench may be smaller than a width of an upper end of the trench. In this case, a width of the uppermost gate electrode among the gate electrodes may be smaller than a width of the lowermost gate electrode.

In yet embodiments, the above method may, prior to stacking the sacrificial layers and the insulating layers, further include forming a buffer dielectric on the substrate. The lowermost sacrificial layer may be formed directly on the buffer dielectric.

At least one of the above and other features and advantages may also be realized by providing a semiconductor memory devices, including gate electrodes and insulating patterns alternately and repeatedly stacked on a substrate, an active pattern penetrating the insulating patterns and the gate electrodes, an information storage layer disposed between the active pattern and the gate electrodes, and a device isolation pattern disposed on the substrate at one side of the stacked insulating patterns and the gate electrodes. The gate electrodes and the insulating patterns may have outer sidewalls adjacent to the device isolation patterns, and the outer sidewall of each of the gate electrodes may be recessed further laterally toward the active pattern than the outer sidewall of the insulating pattern positioned directly on each of the gate electrodes.

In still further embodiments, an undercut region may be defined by the outer sidewall of each of the gate electrodes being recessed, and the device isolation pattern may extend to fill the undercut region.

In even further embodiments, top surfaces of the gate electrodes may have widths in a first direction parallel to a top surface of the substrate. The gate electrodes and the insulating patterns may extend in a second direction perpendicular to the first direction and parallel to the top surface of the substrate. At this time, a width of the lowermost gate electrode among the gate electrodes may be greater than a width of the uppermost gate electrode. In this case, the outer sidewalls of the insulating patterns may be oblique.

In yet further embodiments, the lowermost gate electrode among the gate electrodes may control a first channel region defined in the substrate below the lowermost gate electrode, and a second channel region in the active pattern neighboring to the lowermost gate electrode. At this time, a threshold voltage of the first channel region may be different from a threshold voltage of the second channel region.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
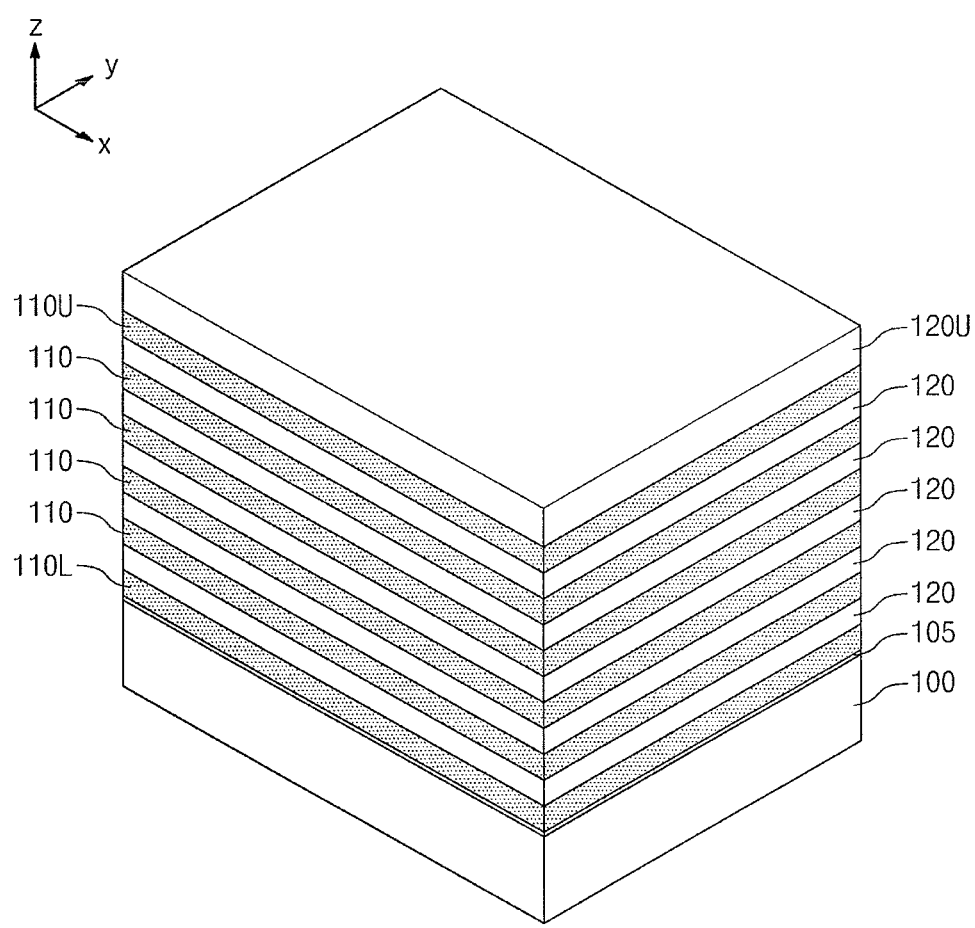
FIGS. 1 through 8 illustrate perspective views of stages in a method of fabricating a three-dimensional semiconductor memory device according to an embodiment.

Korean Patent Application No. 10-2009-0092452, filed on Sep. 29, 2009, in the Korean Intellectual Property Office, and entitled: "Three-Dimensional Semiconductor Memory Device and Method of Fabricating the Same," is incorporated by reference herein in its entirety.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Throughout, it will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Also, in the drawings, the dimensions of layers and regions are exaggerated for clarity of illustration. Further, though terms like a first, a second, and a third are used to describe various regions and layers in various embodiments of the inventive concept, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof. The word 'and/or' means that one or more or a combination of relevant constituent elements is possible. Like reference numerals refer to like elements throughout.

<Embodiment 1>

FIGS. 1 through 8 illustrate perspective views of stages in a method of fabricating a three-dimensional semiconductor memory device according to an embodiment. FIG. 9 illustrates a detailed cross-sectional view of portion A in FIG. 6.

Referring to FIG. 1, sacrificial layers 110L, 110, 110U and insulating layers 120, 120U may be alternately and repeatedly stacked on a substrate 100. The substrate 100 may be a semiconductor substrate. For example, the substrate 100 may be a silicon substrate, a germanium substrate, a silicon-germanium substrate, a compound semiconductor substrate, or the like. The substrate 100 may be doped with a first conductive type dopant. The sacrificial layers 110L, 110, 110U may be preferably formed of a material having an etch selectivity with respect to the insulating layers 120, 120U. For example, the insulating layers 120, 120U may be formed of oxide, and the sacrificial layers 110L, 100, 110U may include nitride and/or oxy-nitride. The inventive concept is not limited thereto. The insulating layers 120, 120U may be formed of another insulating material, and the sacrificial layers 110L, 110, 110U may be formed of another material having an etch selectivity with respect to the insulating layers 120, 120U. The sacrificial layers 110L, 110, 110U may be formed of the same material. Likewise, the insulating layers 120, 120U may be formed of the same material.

For example, the sacrificial layers 110L, 110, 110U may be formed to have a substantially same thickness. In another example, a lowermost sacrificial layer 110L and an uppermost sacrificial layer 110U, among the sacrificial layers 110L, 110, 110U, may be thicker than the sacrificial layers 110 between the lowermost sacrificial layer 110L and the uppermost sacrificial layer 110U. In this case, the sacrificial layers 110 between the lowermost sacrificial layer 110L and the uppermost sacrificial layer 110U may have a substantially same thickness. In yet another example, among the insulating layers 120, 120U, the uppermost insulating layer 120U may be thicker than the underlying insulating layers 120. The insulating layers 120 below the uppermost insulating layer 120U may have a substantially same thickness.

Before the sacrificial layers 110L, 110, 110U and the insulating layers 120, 120U are formed, a buffer dielectric 105 may be formed on the substrate 100. The lowermost sacrificial layer 110L may be formed, e.g., directly, on the buffer dielectric 105. The buffer dielectric 105 may be formed of a dielectric material having an etch selectivity with respect to the sacrificial layers 110L, 110, 110U. For example, the buffer dielectric 105 may be formed of an oxide, e.g., a thermal oxide.

Before the sacrificial layers 110L, 110, 110U and the insulating layers 120, 120U are formed, dopants for controlling a threshold voltage may be implanted into a top surface of the substrate 100. Descriptions regarding the implantation of dopants will be given below.

Figure 2:
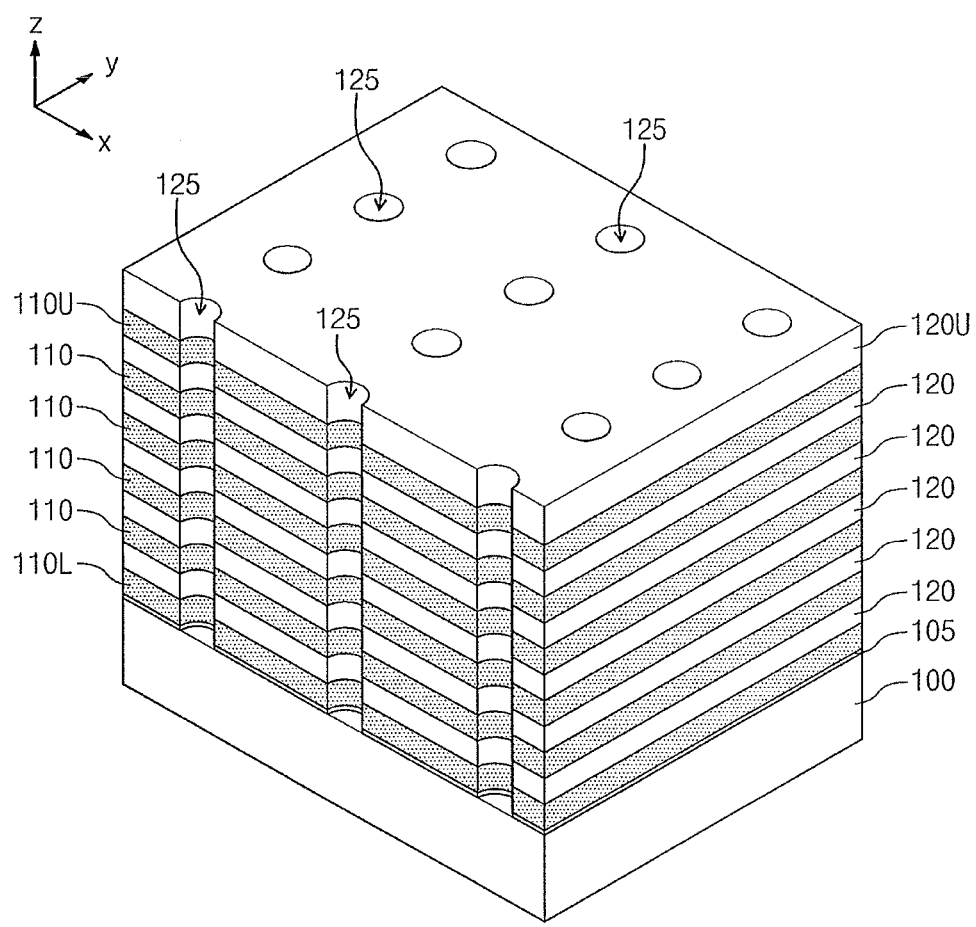

Referring to FIG. 2, the insulating layers 120U, 120 and the sacrificial layers 110U, 110, 110L may be continuously patterned to form channel openings 125 exposing the substrate 100. The channel openings 125 may have a hole shape. The channel openings 125 may be spaced apart from each other. The channel openings 125 may be two-dimensionally arranged in a first direction and a second direction perpendicular to the first direction. The first direction and the second direction are parallel to the top surface of the substrate 100. In the drawings, an x-axis direction may correspond to the first direction and a y-axis direction may correspond to the second direction. The channel openings 125 may have a circular, elliptical, or polygonal shape in plan view. However, the inventive concept is not limited thereto. The channel openings 125 may be provided in shapes other than the foregoing hole shape. According to an embodiment, the channel openings 125 may have a groove shape extending in the first direction, i.e., x-axis direction.

Figure 3:
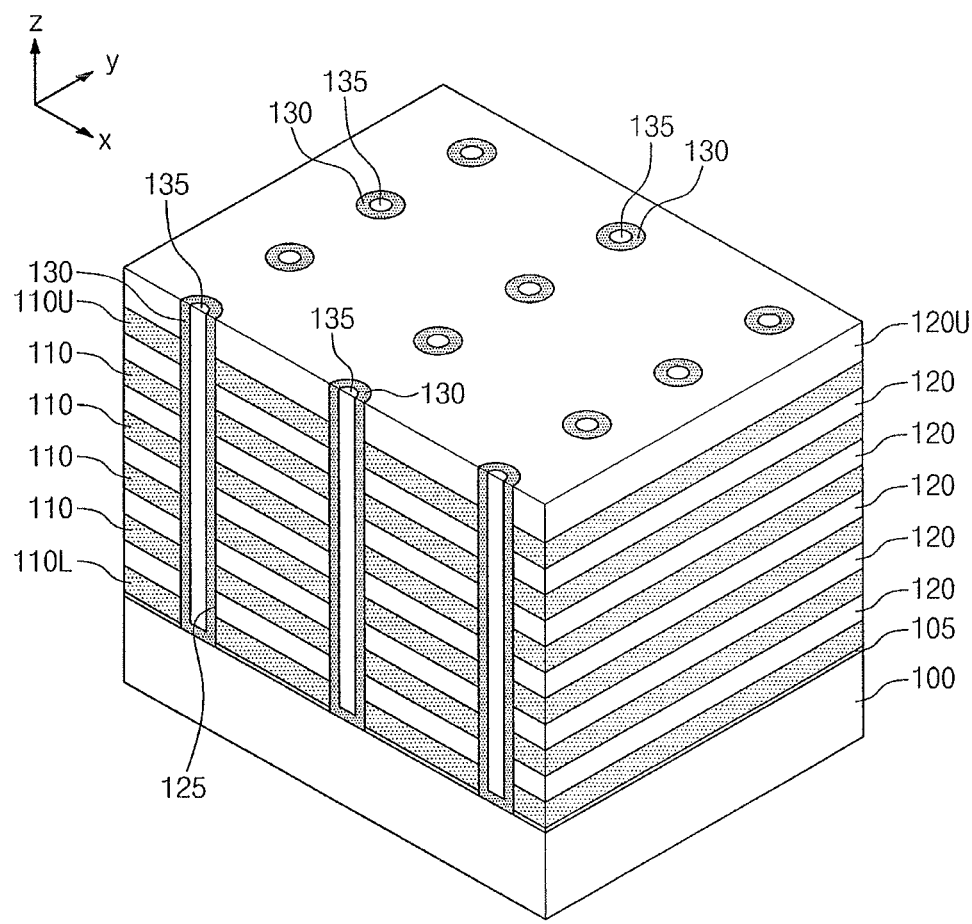

Referring to FIG. 3, active patterns 130 may be formed in the channel openings 125. The active pattern 130 may contact the substrate 100 exposed in the channel opening 125. The active pattern 130 may extend on sidewalls of the channel openings 125 in a third direction vertical to the first direction and the second direction. The third direction may correspond to a z-axis direction in the drawings. The third direction may be vertical to the top surface of the substrate 100. The active pattern 130 may be formed of a semiconductor material. The active pattern 130 may be doped with a first conductive type dopant or may be undoped. A method of forming the active pattern 130 will now be described.

An active layer (not shown) may be conformally formed on the substrate 100 having the channel openings 125. The active layer may be formed by using a chemical vapor deposition (CVD) method, an atomic layer deposition (ALD) method or the like. The active layer may be formed of silicon, germanium, silicon-germanium and/or compound semiconductor material. According to an embodiment, the active layer may be formed of the same material as the substrate 100. The active layer may exist in a polycrystalline state. An interlayer dielectric filling the channel openings 125 may be formed on the active layer. The filled interlayer dielectric may be formed of a dielectric material having an etch selectivity with respect to the sacrificial layers 110L, 110, 110U. For example, the filled interlayer dielectric may be formed of oxide or the like. The filled interlayer dielectric and the active layer may be planarized until the uppermost insulating layer 120U is exposed to form the active pattern 130 and a dielectric pattern 135 in the channel opening 125. The active pattern 130 may be formed in a hollow pipe shape, a hollow cylindrical shape, a hollow macaroni shape or the like, as shown in FIG. 3, and the inside of the active pattern 130 may be filled with the dielectric pattern 135.

Figure 13:
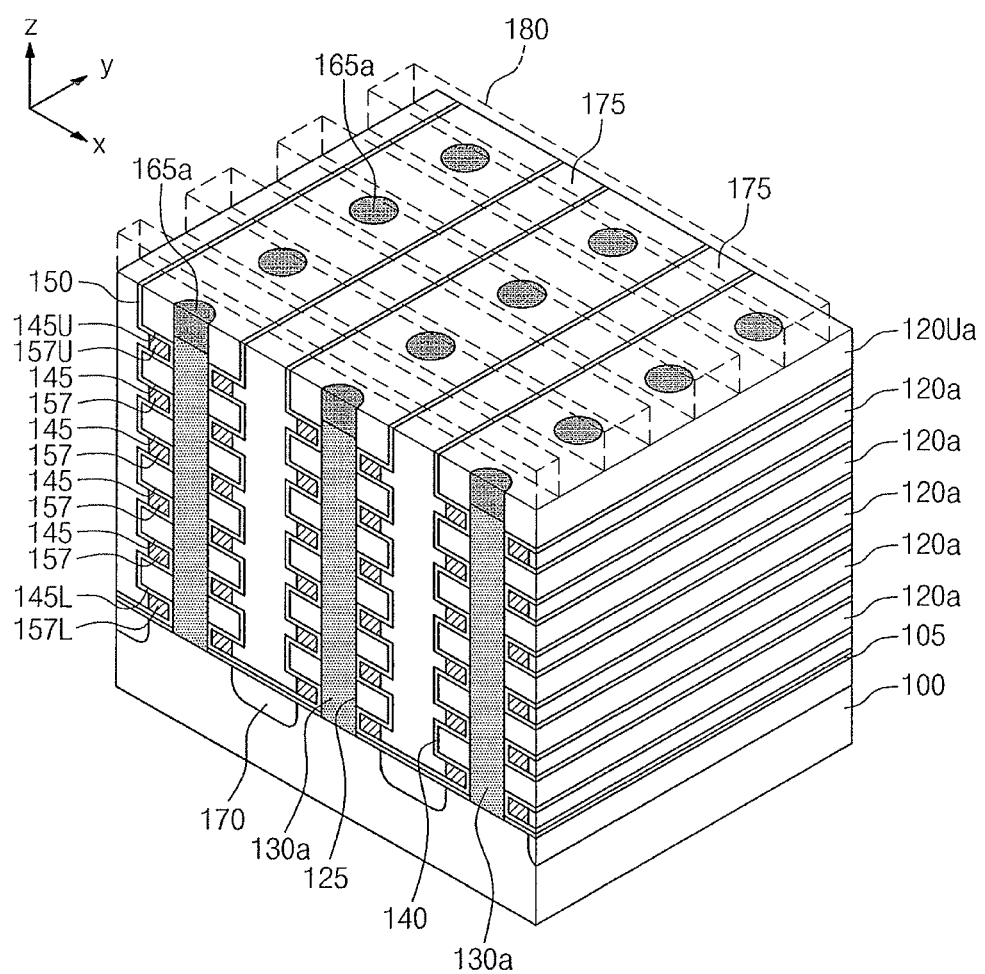
FIG. 13 illustrates a perspective view of a modified example of the three-dimensional semiconductor memory device according to an embodiment.

Meanwhile, according to an embodiment, the dielectric pattern 135 may be omitted, so an active pattern (130a of FIG. 13) may completely fill the channel opening 125, as shown in FIG. 13. In this case, after the active layer is formed to completely fill the channel opening 125, the active layer may be planarized until the uppermost insulating layer 120U is exposed to form the active pattern. Alternatively, a selective epitaxial growth process may be performed by using the substrate exposed in the channel opening 125 as a seed layer, to form the active pattern (130a of FIG. 13) completely filling the channel opening 125. When the active pattern is formed through the selective epitaxial growth process, the active pattern may exist in a single crystalline state.

Figure 4:
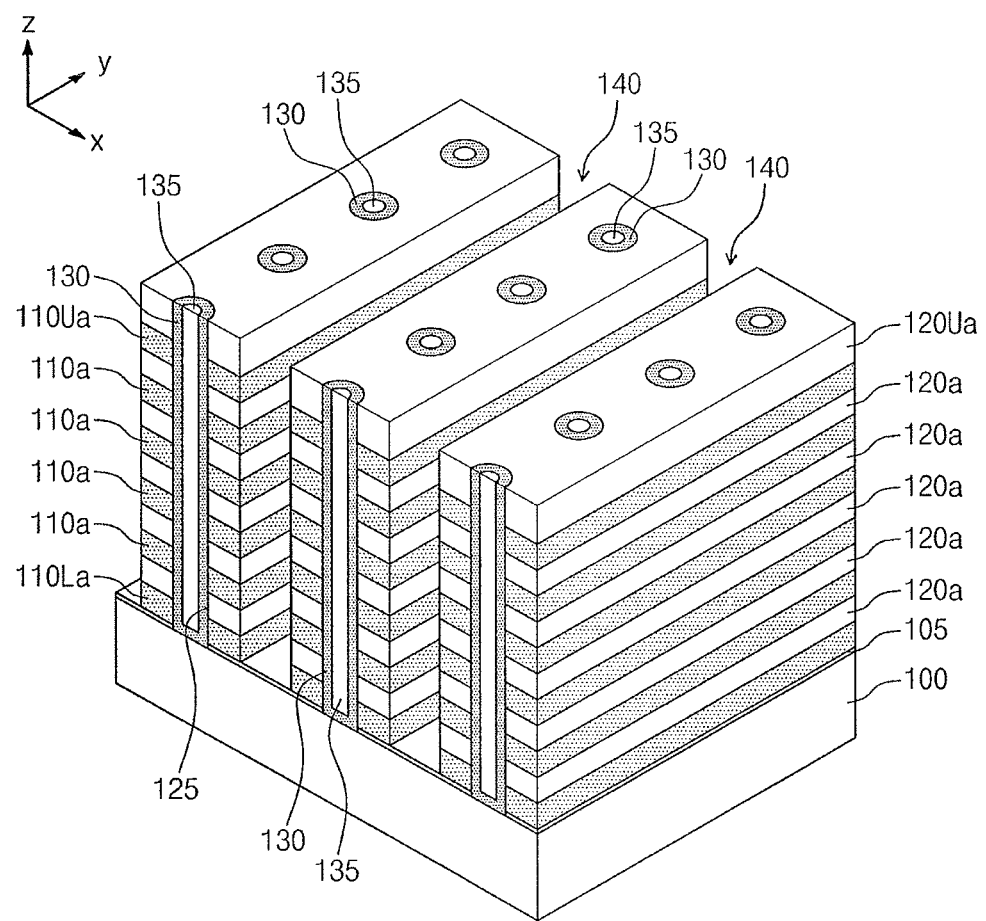

Referring to FIG. 4, the insulating layers 120U, 120 and the sacrificial layers 110U, 110, 110L may be continuously patterned to form trenches 140. The trenches 140 may define sacrificial patterns 110La, 110a, 110Ua and insulating patterns 120a, 120Ua alternately arranged and repeatedly stacked. The trenches 140 may extend to a predetermined depth along the third direction, and may extended along the second direction (y-axis direction) parallel to each other. By doing so, the sacrificial patterns 110La, 110a, 110Ua and the insulating patterns 120a, 120Ua may have a line shape extending in parallel along the second direction (y-axis direction). Active patterns 130 arranged in the first direction (x-axis direction) may define one row, and active patterns 130 arranged in the second direction (y-axis direction) may define one column. Two or more rows and two or more columns may be arranged on the substrate 100. Each of the trenches 140 may be disposed between one pair of columns adjacent to each other. The two or more active patterns 130 included in the one column may penetrate a single stack structure including the sacrificial patterns 110La, 110a, 110Ua and the insulating patterns 120a, 120Ua alternately and repeatedly stacked.

The sacrificial patterns 110La, 110a, 110Ua and the insulating patterns 120a, 120Ua may be exposed in a sidewall of the trench 140. The buffer dielectric 105 may be exposed in a bottom of the trench 140. Alternatively, while the trench 140 is formed, the buffer dielectric 105 and the substrate 100 may be etched, so that the substrate 100 may be exposed in the bottom of the trench 140. Hereinafter, for convenience of description, an embodiment in which the bottom surface of the trench 140 corresponds to the buffer dielectric 105 will be described.

Figure 5:
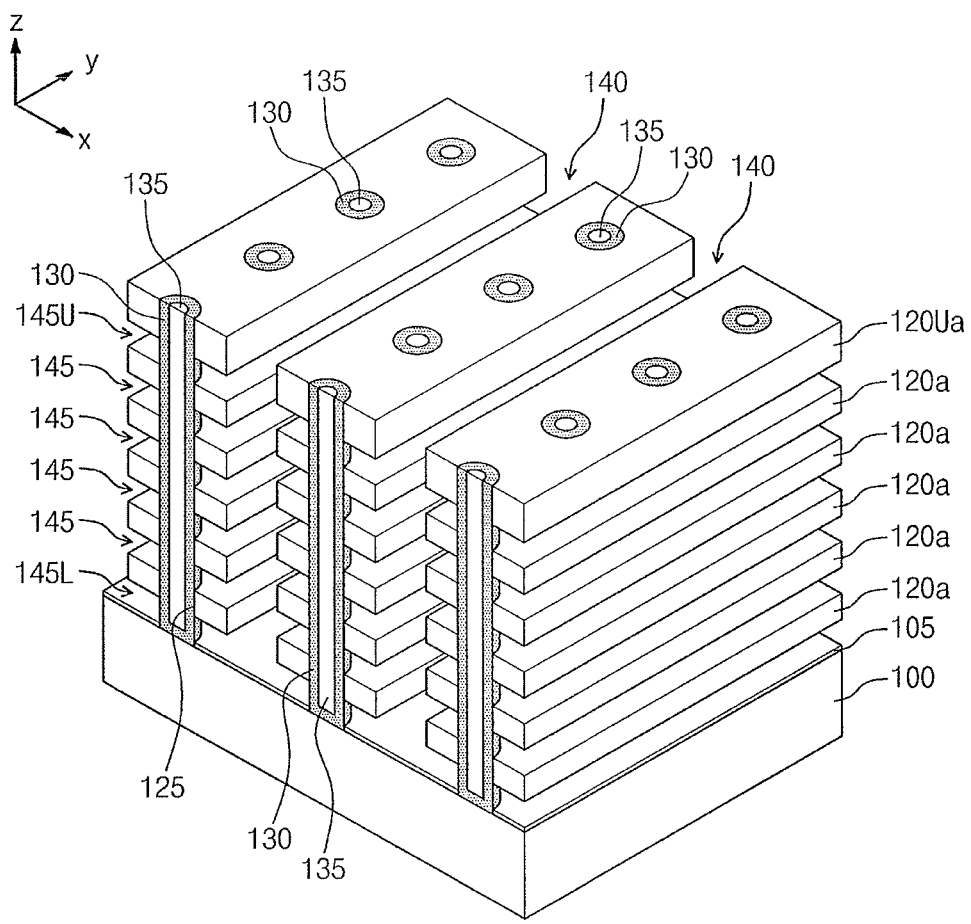

Referring to FIG. 5, the sacrificial patterns 110La, 110a, 110Ua exposed in the trench 140 may be removed to form recess regions 145L, 145, 145U. The exposed sacrificial patterns 110La, 110a, 110Ua may be removed by using a wet etch. The recess regions 145L, 145, 145U may expose some portions of a sidewall of the active pattern 130. Among the recess regions 145L, 145, 145U, the lowermost recess region 145L may be formed by removing the lowermost sacrificial pattern 110La, and the uppermost recess region 145U may be formed by removing the uppermost sacrificial pattern 110Ua. The recess regions 145 between the lowermost recess region 145L and the uppermost recess region 145U may be formed by removing the sacrificial patterns 110a between the lowermost sacrificial pattern 110La and the uppermost sacrificial pattern 110Ua. A bottom surface of the lowermost recess region 145L may be defined by the buffer dielectric 105. In the case where the buffer dielectric 105 is omitted, the bottom surface of the lowermost recess region 145L may be defined by the substrate 100.

Figure 6:
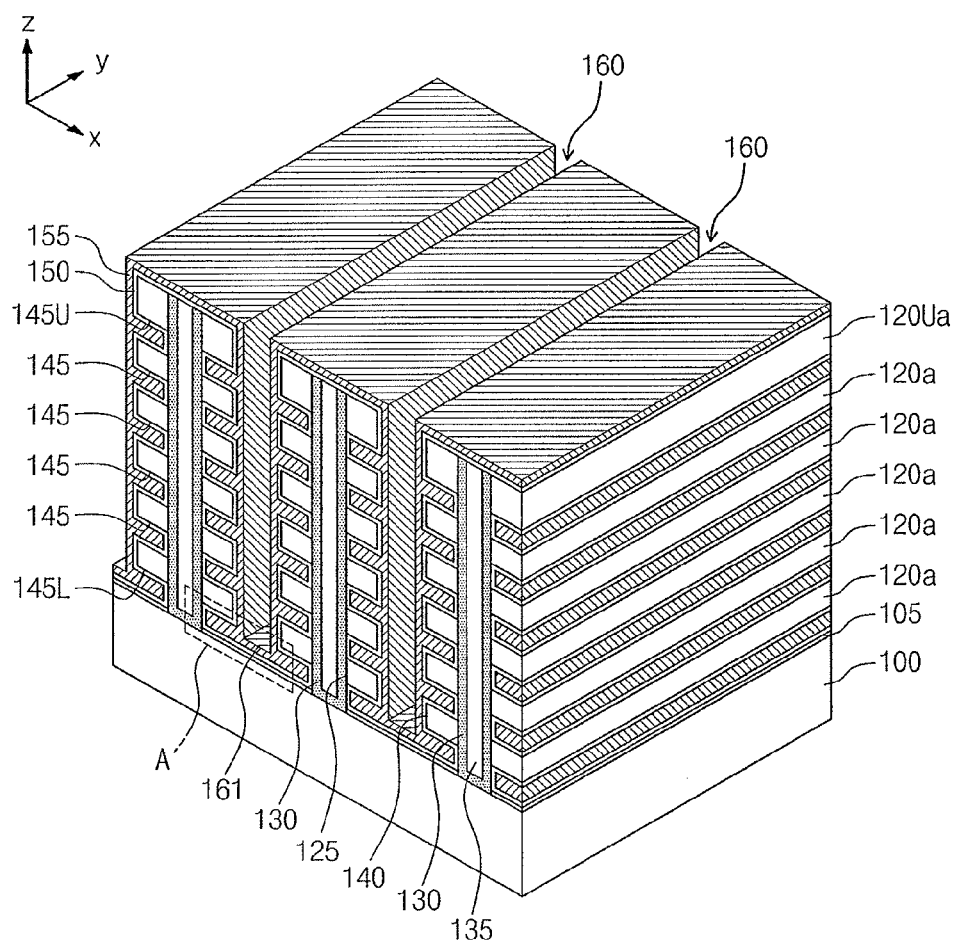

Referring to FIG. 6, an information storage layer 150 may be formed on the substrate 100 having the recess regions 145L, 145, 145U. The information storage layer 150 may be formed by using a deposition technique, e.g., CVD or ALD, having superior step coverage. By doing so, the information storage layer 150 may be conformally formed. According to an embodiment, the information storage layer 150 may be formed at a substantially uniform thickness along inner surfaces of the recess regions 145L, 145, 145U. The information storage layer 150 may not completely fill the recess regions 145L, 145, 145U.

The information storage layer 150 may include a charge storage layer. For example, the information storage layer 150 may include an insulating layer or the like including a trap insulating layer, a floating gate and/or conductive nano dots. In addition, the information storage layer 150 may further include a tunnel insulating layer and a blocking insulating layer. The tunnel insulating layer may be formed in a single layer or multi-layer structure. The blocking insulating layer may be also formed in a single layer or multi-layer structure. The blocking insulating layer may include a high-k dielectric having a dielectric constant higher than the tunnel insulating layer. The tunnel insulating layer may be first formed, the charge storage layer may be secondly formed, and the blocking insulating layer may be lastly formed.

A gate conductive layer 155 may be formed on the substrate 100 including the information storage layer 150, e.g., the gate conductive layer 155 may be formed directly on the information storage layer 150. The gate conductive layer 155 may fill, e.g., completely fill, the recess regions 145L, 145, 145U. The gate conductive layer 155 will be described in more detail with reference to FIGS. 6 and 9.

Referring to FIGS. 6 and 9, as aforementioned, the gate conductive layer 155 may fill the recess regions 145L, 145, 145U. At this time, an empty region 160 surrounded by the gate conductive layer 155 may be defined in the trench 140. That is, the gate conductive layer 155 may partially fill the trench 140, and a remaining portion of the trench 140 may be empty.

A bottom surface 161 of the empty region 160 may be defined by the gate conductive layer 155. Likewise, a sidewall of the empty region 160 may be defined by the gate conductive layer 155. The empty region 160 may be opened upward. As illustrated in FIG. 9, the bottom surface 161 of the empty region 160 may be positioned at a first height H1 from a top surface of the substrate 100. A portion 155a of the gate conductive layer 155 may fill the lowermost recess region 145L, and may have a top surface 154. The top surface 154 of the portion 155a of the gate conductive layer 155 may contact the information storage layer 150 disposed between the top surface of the lowermost recess region 145L and the portion 155a. The top surface 154 of the portion 155a of the gate conductive layer 155 may be positioned at a second height H2 from the top surface of the substrate 100. At this time, the first height H1 may be smaller than the second height H2. In other words, the bottom surface 161 of the empty region 160 may be lower than the top surface 154 of the portion 155a of the gate conductive layer 155.

The gate conductive layer 155 may be formed by using a deposition process, e.g., CVD or ALD, having superior step coverage. The gate conductive layer 155 may be formed of a conductive material. For example, the gate conductive layer 155 may include at least one of a metal, e.g., one or more of tungsten, aluminum, titanium, tantalum and the like, a conductive metal nitride, e.g., one or more of titanium nitride, tantalum nitride and the like, and a doped semiconductor material, e.g., one or more of doped silicon, doped germanium, doped silicon-germanium and the like.

Figure 7:
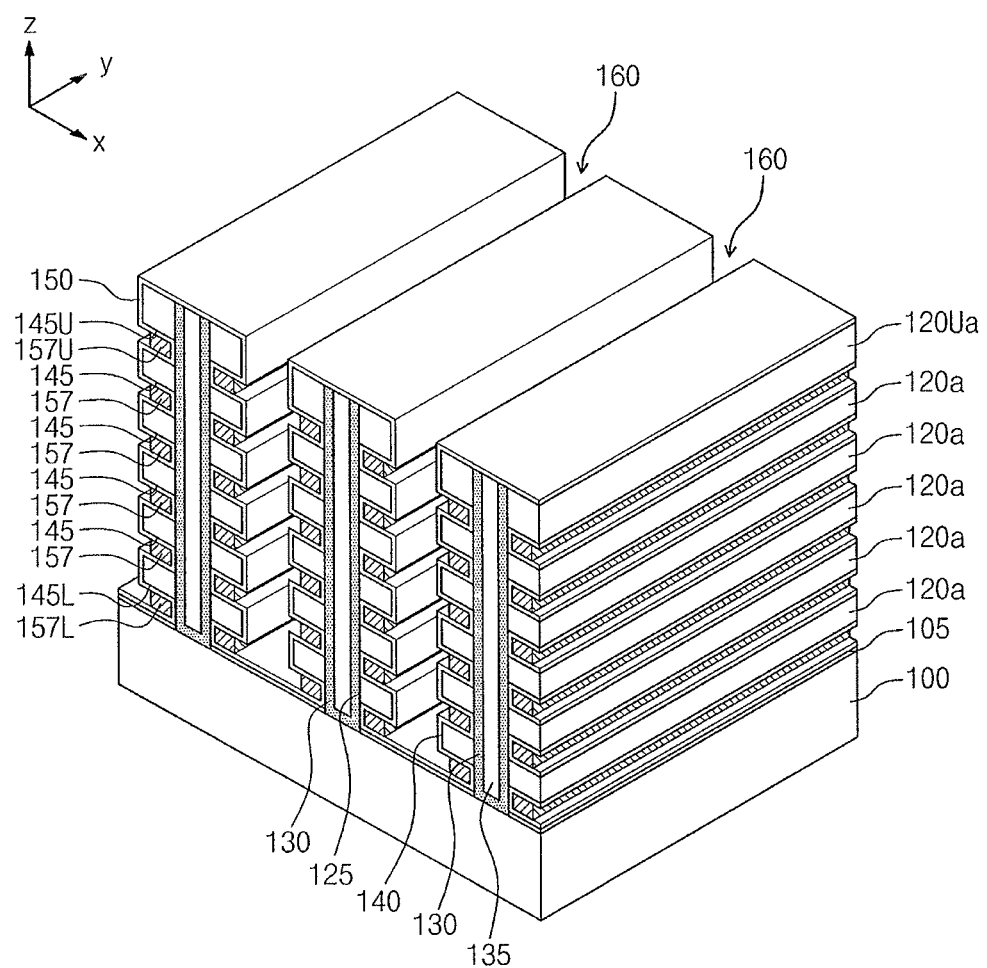

Referring to FIG. 7, an isotropic etch process may be performed with respect to the gate conductive layer 155 through the empty region 160, e.g., portions of the gate conductive layer 155 may be removed, to form gate electrodes 157L, 157, 157U in respective recess regions 145L, 145, 145U. The gate electrodes 157L, 157, 157U may correspond to predetermined portions of the gate conducive layer 155 positioned in the recess regions 145L, 145, 145U, respectively. As the gate conductive layer 155 is etched by using the isotropic etch process, the gate electrodes 157L, 157, 157U may be separated from one another. Among the gate electrodes 157L, 157, 157U, a lowermost gate electrode 157L may correspond to a gate of a lower select transistor, and an uppermost gate electrode 157U may correspond to a gate of an upper select transistor. The gate electrodes 157 between the lowermost gate electrode 157L and the uppermost gate electrode 157U may correspond to control gates of memory cells, respectively.

The isotropic etch process may be performed through the empty region 160. Therefore, the sidewall and the bottom surface of the empty region 160 may be etched substantially simultaneously. In other words, portions of the gate conductive layer 155 disposed on outer sidewalls of the insulating patterns 120a, 120Ua connecting the gate electrodes 157L, 157, 157U may be etched substantially simultaneously. By doing so, exposure times of the gate electrodes 157L, 157, 157U to the isotropic etch process may be substantially uniform. As a result, the gate electrodes 157L, 157, 157U may be formed reproducibly. Also, etch damage of other structures, e.g., information storage layer 150 and/or trench structure, may be minimized, e.g., due to reduced exposure time.

In contrast, in a conventional method, after the trench is completely filled, the gate conductive layer is etched by using an anisotropic etch process, and an etch depth of the gate conductive layer may be very deep due to a deep trench. Thus, the substrate having the trench may be exposed to the anisotropic etch process for a long time period, so that an upper corner of the trench may be deformed and shapes of at least some of the gate electrodes positioned at a high level may be also damaged. Therefore, etching of the gate conductive layer 155 through the empty region 160 by an isotropic etch process according to embodiments may provide simultaneous etching of the sidewall and bottom surface of the empty region 160, i.e., defined by the gate conductive layer 155. As a result, a process time of the isotropic etch process may be shortened, deformation of the trench 140 may be minimized, and the gate electrodes 157L, 157, 157U may be made reproducibly.

As aforementioned, the bottom surface 161 of the empty region 160 may be formed lower than the top surface 154 of the portion 155a of the gate conductive layer 155 filling the lowermost recess region 145L. By doing so, the lowermost gate electrode 157L may be separated substantially simultaneously with the gate electrodes 157, 157U positioned at different heights.

The gate electrodes 157L, 157, 157U may have outer sidewalls adjacent to the trench 140, and inner sidewalls adjacent to the active pattern 130. Also, the insulating patterns 120a, 120Ua may have outer sidewalls adjacent to the trench 140, and inner sidewalls adjacent to the active pattern 130. By the isotropic etch process, the outer sidewalls of the gate electrodes 157L, 157, 157U may be recessed further laterally, i.e., along the x-axis toward the active pattern 130, than the outer sidewalls of the insulating patterns 120a, 120Ua. The outer sidewalls of the gate electrodes 157L, 157, 157U may be recessed toward the active pattern 130. By doing so, some portions of the recess regions 145L, 145, 145U adjacent the outer sidewalls of the gate electrodes 157L, 157, 157U may be empty. Some empty portions of the recess regions 145L, 145, 145U may have a form of an undercut region.

By the isotropic etch process, the gate conductive layer 155 positioned on the uppermost insulating pattern 120Ua among the insulating patterns 120a, 120Ua may also be removed. The isotropic etch process may be performed by using a wet etch using an etchant. Alternatively, the isotropic etch process may be performed by using a dry etch using an etch gas. In the case where the isotropic etch process is performed by using a dry etch process, it may be possible to supply etch gases in a radical state and/or ionic state into the empty region 160 through a diffusion of the etch gases. By doing so, the etch gases may perform the isotropic etch.

Figure 8:
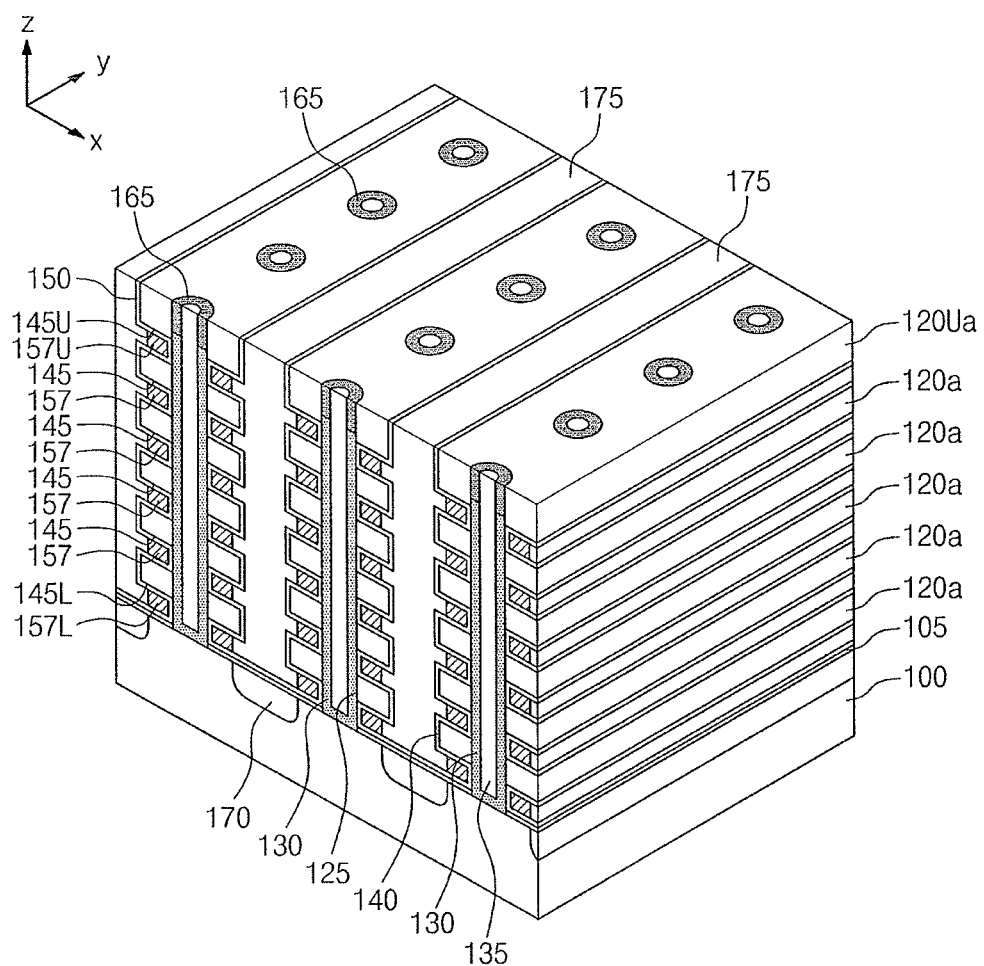
Figure 9:
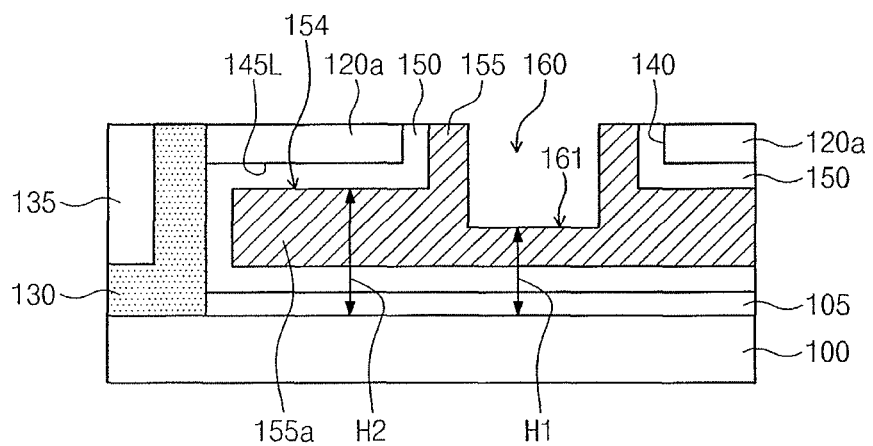
FIG. 9 illustrates a detailed cross-sectional view of portion A of FIG. 6.

Referring to FIG. 8, a common source region 170 may be formed in the substrate 100 below the trench 140. The common source region 170 may have a line shape extending in the second direction, i.e., y-axis direction. The common source region 170 may be a region doped with a second conductive type dopant. The common source region 170 may be formed by implanting second conductive type dopant ions into the substrate 100 below the trench 140. At this time, the uppermost insulating pattern 120Ua may be used as an ion implantation mask. In this case, the information storage layer 150 positioned on the bottom surface of the trench 140 or the buffer dielectric 105/information storage layer 150 positioned on the bottom surface of the trench 140 may be used as an ion implantation buffer layer.

A drain region 165 may be formed in an upper portion of the active pattern 130. The drain region 165 may be doped with the second conductive type dopant. The drain region 165 may be formed by supplying the second conductive type dopant into the upper portion of the active pattern 130. A bottom surface of the drain region 165 may be higher than the top surface of the uppermost gate electrode 157U. Alternatively, the bottom surface of the drain region 165 may have a height proximate to the top surface of the uppermost gate electrode 157U. The drain region 165 may be formed simultaneously with the common source region 170. Alternatively, the drain region 165 may be formed before the common source region 170 is formed. In this case, the drain region 165 may be formed before the trench 140 is formed and after the active pattern 130 is formed. According to an embodiment, the drain region 165 may be formed after the common source region 170 is formed.

A device isolation pattern 175 filling the trench 140 may be formed. The device isolation pattern 175 may fill empty portions of the recess regions 145L, 145, 145U, i.e., portions empty due to the outer sidewalls of the gate electrodes 157L, 157, 157U being laterally recessed. A method of forming the device isolation pattern 175 will now be described. A device isolation layer filling the trench 140 and the empty portions of the recess regions 145L, 145, 145U may be formed on the substrate 100. The device isolation layer may be planarized, until the information storage layer 150 on the uppermost insulating pattern 120Ua is exposed, to form the device isolation pattern 175. The device isolation pattern 175 may be formed of an insulating material having superior gap-fill capability. For example, the device isolation pattern 175 may be formed of a high density plasma oxide layer, a spin on glass (SOG) layer and/or a CVD oxide layer. After the device isolation pattern 175 is formed, the exposed information storage layer 150 may be etched to expose the uppermost insulating pattern 120Ua. At this time, the drain region 165 may be exposed.

Figure 10:
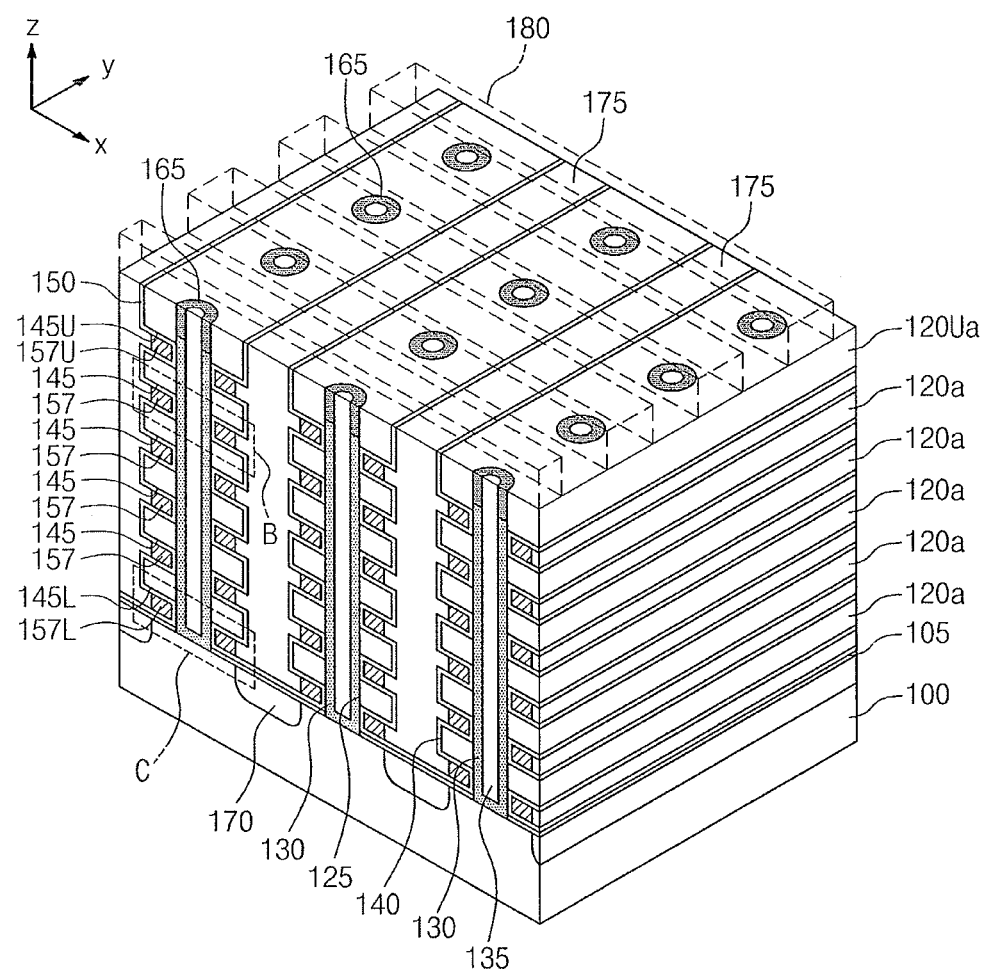
FIG. 10 illustrates a perspective view of a three-dimensional semiconductor memory device according to an embodiment.

A bit line (180 in FIG. 10) electrically connected with the drain region 165 may be formed. By doing so, a three-dimensional semiconductor memory device shown in FIG. 10 may be fabricated. The bit line 180 may extend in the first direction, i.e., x-axis direction. As shown in FIG. 10, the bit line 180 may be formed directly on the uppermost insulating pattern 120Ua and the device isolation pattern 175. Alternatively, after an interlayer dielectric covering the uppermost insulating pattern 120Ua and the device isolation pattern 175 is formed, the bit line 180 may be formed on the interlayer dielectric. In this case, the bit line 180 may be electrically connected with the drain region 165 via a contact plug penetrating the interlayer dielectric.

Figure 11:
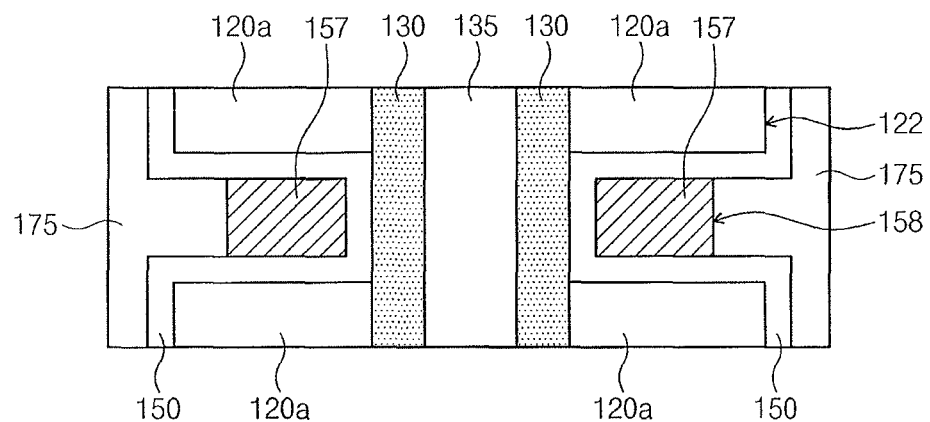
FIG. 11 illustrates a detailed cross-sectional view of portion B of FIG. 10.
Figure 12:
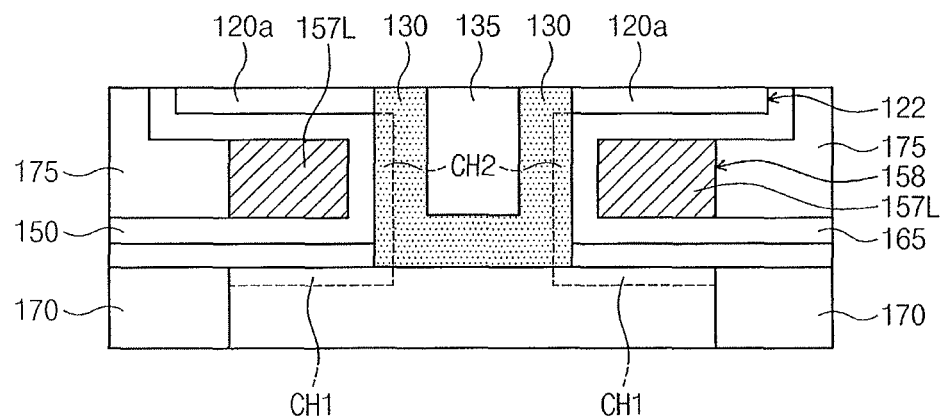
FIG. 12 illustrates a detailed cross-sectional view of portion C of FIG. 10.

FIG. 10 illustrates a perspective view of a three-dimensional semiconductor memory device according to an embodiment, FIG. 11 illustrates a detailed cross-sectional view of portion B of FIG. 10, and FIG. 12 illustrates a detailed cross-sectional view of portion C of FIG. 10.

Referring to FIG. 10, the gate electrodes 157L, 157, 157U and insulating patterns 120a, 120Ua may be alternately and repeatedly stacked on the substrate 100. The alternately stacked gate electrodes 157L, 157, 157U and insulating patterns 120a, 120Ua may constitute a single stack structure. A plurality of stack structures may be disposed on the substrate 100. The plurality of stack structures may be spaced apart from one another in a first direction parallel to a top surface of the substrate 100. The gate electrodes 157L, 157, 157U and the insulating patterns 120a, 120Ua may extend in parallel in a second direction parallel to the top surface of the substrate 100 and perpendicular to the first direction. That is, the stack structures may extend in parallel to one another in the second direction. The first direction may correspond to an x-axis direction in FIG. 10, and the second direction may correspond to a y-axis direction in FIG. 10.

The device isolation pattern 175 may be disposed between the stack structures adjacent to each other. In other words, the device isolation pattern 175 may be disposed on the substrate 100 at one side of the alternately and repeatedly stacked gate electrodes 157L, 157, 157U and insulating patterns 120a, 120Ua. The active pattern 130 may penetrate the alternately and repeatedly stacked gate electrodes 157L, 157, 157U and insulating patterns 120a, 120Ua. The active pattern 130 may extend in a third direction vertical to the first direction and the second direction. The third direction may be a direction vertical to the top surface of the substrate 100. The third direction may correspond to a z-axis direction in FIG. 10. The active pattern 130 may contact the substrate 100. Each of the plurality of active patterns 130 may penetrate each of the stack structures. The information storage layer 150 may be disposed between a sidewall of the active pattern 130 and the gate electrodes 157L, 157, 157U. The plurality of active patterns 130 penetrating the respective stack structures may be arranged in the second direction and may be spaced apart from one another. The active patterns 130 on the substrate 100 may be arranged two-dimensionally in the first direction and the second direction. The active pattern 130 may have a hollow pipe shape, a hollow cylindrical shape, a hollow macaroni shape or the like, as shown in FIG. 10. An inside of the active pattern 130 may be filled with the dielectric pattern 135.

Each of the active patterns 130, the gate electrodes 157L, 157, 157U surrounding each of the active patterns 130, and the information storage layer 150 disposed between each of the active patterns 130 and the gate electrodes 157L, 157, 157U may be included in a single vertical type cell string. The vertical type cell string may include a lower select transistor, a plurality of memory cells, and an upper select transistor, which are connected in series and stacked. Among the gate electrodes 157L, 157, 157U, the lowermost gate electrode 157L corresponds to a gate of the lower select transistor, and the uppermost gate electrode 157U corresponds to a gate of the upper select transistor. The gate electrodes 157 between the lowermost gate electrode 157L and the uppermost gate electrode 157U correspond to gates of the memory cells, respectively. The information storage layer 150 between the gate electrodes 157 and the active pattern 130 corresponds to a data storage element of the memory cell. The information storage layer 150 between the lowermost gate electrode 157L and the active pattern 130 may be included in a gate dielectric of the lower select transistor, and the information storage layer 150 between the uppermost gate electrode 157U and the active pattern 130 may be included in a gate dielectric of the upper select transistor.

Referring to FIGS. 10, 11 and 12, the gate electrodes 157L, 157, 157U may have inner sidewalls adjacent to the active pattern 130, and outer sidewalls 158 adjacent to the device isolation pattern 175. Likewise, the insulating patterns 120a, 120Ua may have inner sidewalls adjacent to the active pattern 130, and outer sidewalls 122 adjacent to the device isolation patterns 175. The outer sidewall 158 of each of the gate electrodes 157L, 157, 157U may be recessed further laterally toward the active pattern 130, i.e., may be closer to the active pattern 130, as compared with the outer sidewall 122 of each of the insulating patterns 120a, 120Ua positioned, e.g., directly, on each of the gate electrodes 157L, 157, 157U. That is, a distance between the outer sidewall 158 and the active pattern 130 may be smaller than a distance between the outer sidewall 122 and the active pattern 130. In other words, the outer sidewall 122 of each of the insulating patterns 120a, 120Ua may protrude further laterally than the outer sidewall 158 of each respective underlying gate electrodes 157L, 157, 157U. An undercut region may be defined by the outer sidewall 158 of each of the gate electrodes 157L, 157, 157U being recessed. The undercut region may be defined by the outer sidewall 158 of each of the gate electrodes 157L, 157, 157U and protruding portions of the underlying and/or overlying insulating patterns 120a, 120Ua. The device isolation pattern 175 may extend toward the outer sidewalls 158 to fill the undercut regions.

The common source region 170 may be disposed in the substrate 100 below the device isolation pattern 175. The common source region 170 may have a line shape extending in the second direction, i.e., the y-axis direction. The drain region 165 may be disposed in an upper portion of the active pattern 130. The drain region 165 and the common source region 170 may be doped with the same conductive type dopant. The bit line 180 may be electrically connected with the drain region 165. The bit line 180 may extend in the first direction, i.e., the x-axis direction. That is, the bit line 180 may cross the gate electrodes 157L, 157, 157U. The plurality of bit lines 180 may be disposed on the substrate 100. The plurality of bit lines 180 may be parallel to each other. One bit line 180 may be electrically connected with the plurality of drain regions 165, which are arranged in the first direction and formed in the plurality of active patterns 130 constituting one column. The bit line 180 may be disposed on the uppermost insulating pattern 120Ua and the device isolation pattern 175. The bit line 180 may be disposed on an interlayer dielectric disposed on the uppermost insulating pattern 120Ua and the device isolation pattern 175. In this case, the bit line 180 may be electrically connected with the drain region 165 via a contact plug penetrating the interlayer dielectric.

A channel region of the memory cell may be defined in the active pattern 130 corresponding to a gate of the memory cell and adjacent to the gate electrode 157. Likewise, a channel region of the upper select transistor may be defined in the active pattern adjacent to the uppermost gate electrode 157U. The lower select transistor may include a first channel region and a second channel region. FIG. 12 illustrates a detailed view of portion C, i.e., lower select transistor, in FIG. 10.

Referring to FIGS. 10 and 12, the lower select transistor may include a first channel region CH1 defined in the substrate 100 below the lowermost gate electrode 157L, and a second channel region CH2 defined in the active pattern 130 adjacent to the lowermost gate electrode 157L. The lowermost gate electrode 157L may define the first and second channel regions CH1 and CH2. A threshold voltage of the first channel region CH1 may be different from a threshold voltage of the second channel region CH2. An absolute value of the threshold voltage of the first channel region CH1 may be greater than an absolute value of the threshold voltage of the second channel region CH2.

The buffer dielectric 105 may be disposed between the lowermost gate electrode 157L and the substrate 100. Also, the information storage layer 150 may extend to be disposed between the buffer dielectric 105 and the lowermost gate electrode 157L. The information storage layer 150 and the buffer dielectric 105 between the lowermost gate electrode 157L and the substrate 100 may be included in a first gate dielectric of the lower select transistor. The information storage layer 150 between the lowermost gate electrode 157L and the active pattern 130 may be included in a second gate dielectric of the lower select transistor. Since the first gate dielectric of the lower select transistor may be formed thicker than the second gate dielectric, the absolute value of the threshold voltage of the first channel region CH1 may be greater than the absolute value of the threshold voltage of the second channel region CH2.

Alternatively, the buffer dielectric 105 may be omitted. In this case, by making a dopant concentration of the first channel region CH1 different from a dopant concentration of the second channel region CH2, it may be possible to differently control the threshold voltage of the first channel region CH1 from the threshold voltage of the second channel region CH2. For example, by using the process of implanting dopants for controlling the threshold voltage into the substrate 100 described with reference to FIG. 1 implantation process, the dopant concentration of the first channel region CH1 may be controlled differently from the dopant concentration of the second channel region CH2. In operation of a three-dimensional semiconductor memory device, the channels formed in the first and second channel regions CH1 and CH2 are connected with each other, and the channel formed in the first channel region CH1 may be connected with the common source region 170.

Since the lower select transistor includes the first and second channel regions CH1 and CH2 having threshold voltages different from each other, an error in programming operation of the three-dimensional semiconductor memory device may be minimized. For example, in a state that the lower select transistor is turned off, a punch-through phenomenon between the channels of the memory cells of the active pattern 130 and the common source region 170 may be minimized.

Meanwhile, the active pattern 130 may be provided in a hollow cylindrical shape, pipe shape or macaroni shape. Alternatively, the active pattern 130 may have a different shape, which will be described with reference to FIG. 13. FIG. 13 illustrates a perspective view of a modified example of the three-dimensional semiconductor memory device according to an embodiment.

Referring to FIG. 13, a three-dimensional semiconductor memory device may be substantially the same as the device described previously with reference to FIGS. 10-12, with the exception of an active pattern 130a. The active pattern 130a may penetrate gate electrodes 157L, 157, 157U and insulating patterns 120a, 120Ua alternately and repeatedly stacked. The active pattern 130a may contact the substrate 100. The active pattern 130a may have a pillar shape extending upward from the top surface of the substrate 100. In this case, the dielectric pattern 135 shown in FIG. 10 is not required. A drain region 165a may be disposed in an upper portion of the active pattern 130a. The drain region 165a may be doped with a dopant having the same conductivity type as the common source region 170.

<Embodiment 2>

A three-dimensional semiconductor memory device according to another embodiment may be similar to that described previously with reference to FIGS. 1-13. Accordingly, descriptions of the same elements will not be repeated in detail.

FIGS. 14 through 17 illustrate perspective views of stages in a method of fabricating a three-dimensional semiconductor memory device according to another embodiment. The method of fabricating the three-dimensional semiconductor memory device according to the present embodiment may include the fabricating stages described with reference to FIGS. 1 through 3.

Figure 14:
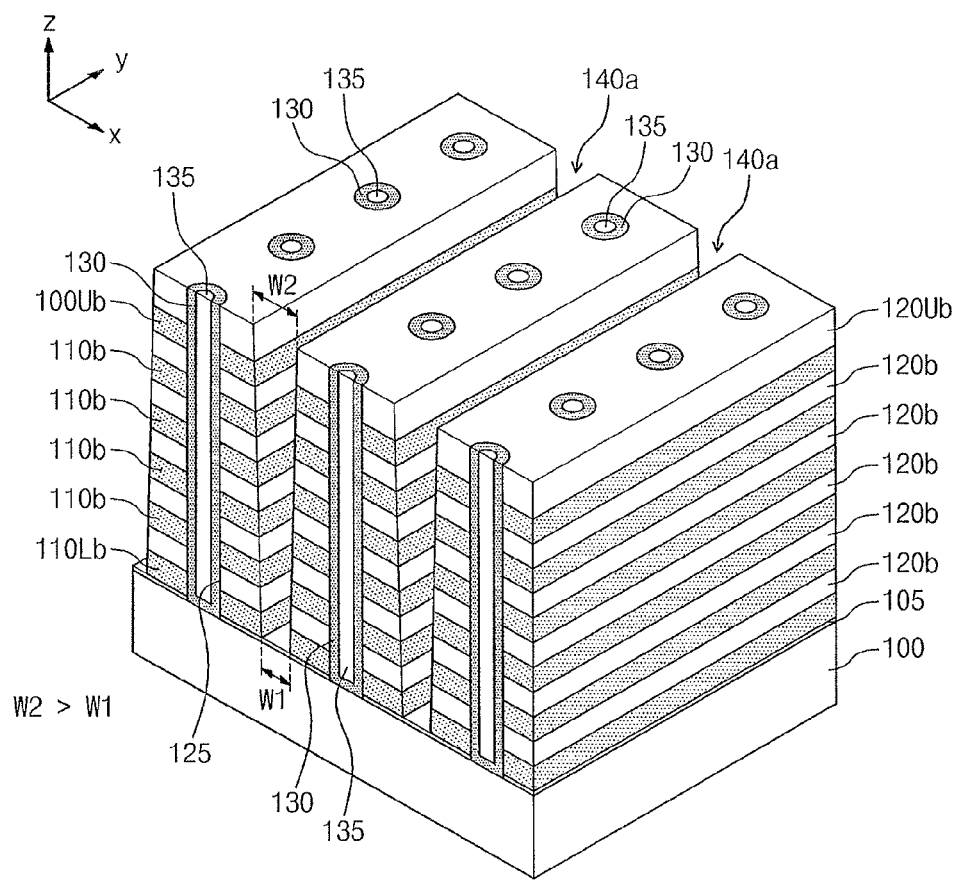
FIGS. 14 through 17 illustrate perspective views of stages in a method of fabricating a three-dimensional semiconductor memory device according to another embodiment.

Referring to FIGS. 3 and 14, the insulating layers 120U, 120 and the sacrificial layers 110U, 110, 110L may be continuously patterned to form trenches 140a. The trenches 140a may be spaced apart laterally from the channel openings 125. The active patterns 130 may be arranged two-dimensionally in a first direction and a second direction, which may be parallel to a top surface of the substrate 100 and perpendicular to each other. The first direction and the second direction may correspond to an x-axis direction and a y-axis direction shown in FIG. 14, respectively. The active patterns 130 arranged in the first direction may form one row, and the active patterns 130 arranged in the second direction may form one column. Two or more rows and two or more columns may be arranged on the substrate 100. Each of the trenches 140a may be disposed between one pair of columns adjacent to each other. The trench 140a may extend in the second direction. The trench 140a may expose the buffer dielectric 105 or the substrate 100.

According to the present embodiment, an inner sidewall of the trench 140a may be formed obliquely. That is, a lower end, e.g., bottom, of the trench 140a may have a first width W1 in the first direction, and an upper end, e.g., top, of the trench 140a may have a second width W2 in the first direction. The first width W1 of the lower end of the trench 140a may be smaller than the second width W2 of the upper end of the trench 140a, i.e., W2>W1. Therefore, a width of the trench 140a in the first direction may increase gradually as a distance from the bottom, i.e., along the third direction, increases. The trench 140a may define alternately and repeatedly stacked sacrificial patterns 110Lb, 110b, 110Ub and insulating patterns 120b, 120Ub. Due to the shape of the trench 140a, a width of the lowermost sacrificial pattern 110Lb may be greater than a width of the uppermost sacrificial pattern 110Ub. Among the sacrificial patterns 110b between the lowermost sacrificial pattern 110Lb and the uppermost sacrificial pattern 110Ub, a width of a sacrificial pattern positioned at a relatively low level may be greater than a width of a sacrificial pattern positioned at a relatively high level. The width of the sacrificial pattern 110Lb, 110, or 110Ub may correspond to a horizontal distance along the first direction between both outer sidewalls of the sacrificial pattern 110Lb, 110b, or 110Ub. The outer sidewalls of the sacrificial pattern 110Lb, 110b, or 110Ub may constitute the inner sidewall of the trench 140a. Likewise, among the insulating patterns 120b, 120Ub, a width of the insulating pattern positioned at a relatively low level may be greater than a width of the insulating pattern positioned at a relatively high level. Among the insulating patterns 120b, 120Ub, the uppermost insulating pattern 120Ub may have the smallest width.

Figure 15:
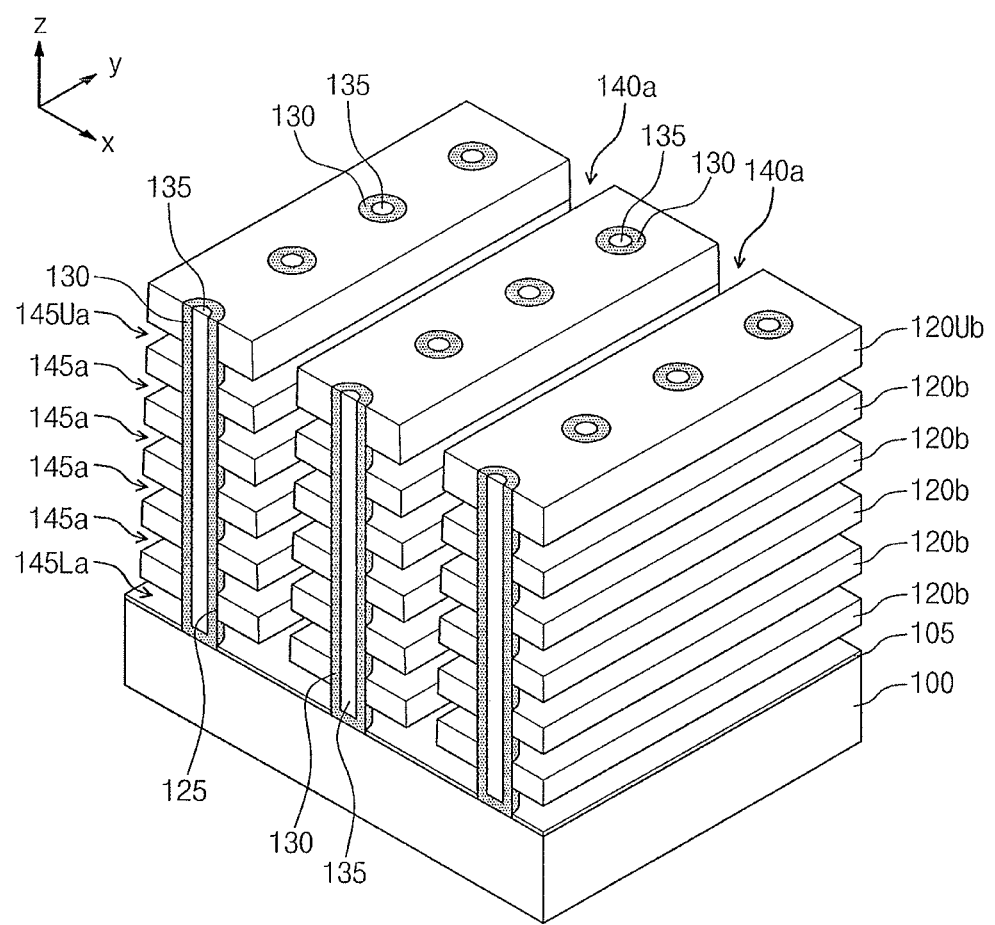

Referring to FIG. 15, the sacrificial patterns 110Lb, 110b, 110Ub exposed in the trench 140a may be removed to form recess regions 145La, 145a, 145Ua. The exposed sacrificial patterns 110Lb, 110b, 110Ub may be removed by using an isotropic etch, e.g., a wet etch or the like. The recess regions 145La, 145a, 145Ua may expose a sidewall of the active pattern 130. The lowermost recess region 145La may be formed by removing the lowermost sacrificial pattern 110Lb, and the uppermost recess region 145Ua may be formed by removing the uppermost sacrificial pattern 110Ub. The recess regions 145a between the lowermost recess region 145La and the uppermost recess region 145Ua may be formed by removing the sacrificial patterns 110b between the lowermost sacrificial pattern 110Lb and the uppermost sacrificial pattern 110Ub.

Figure 16:
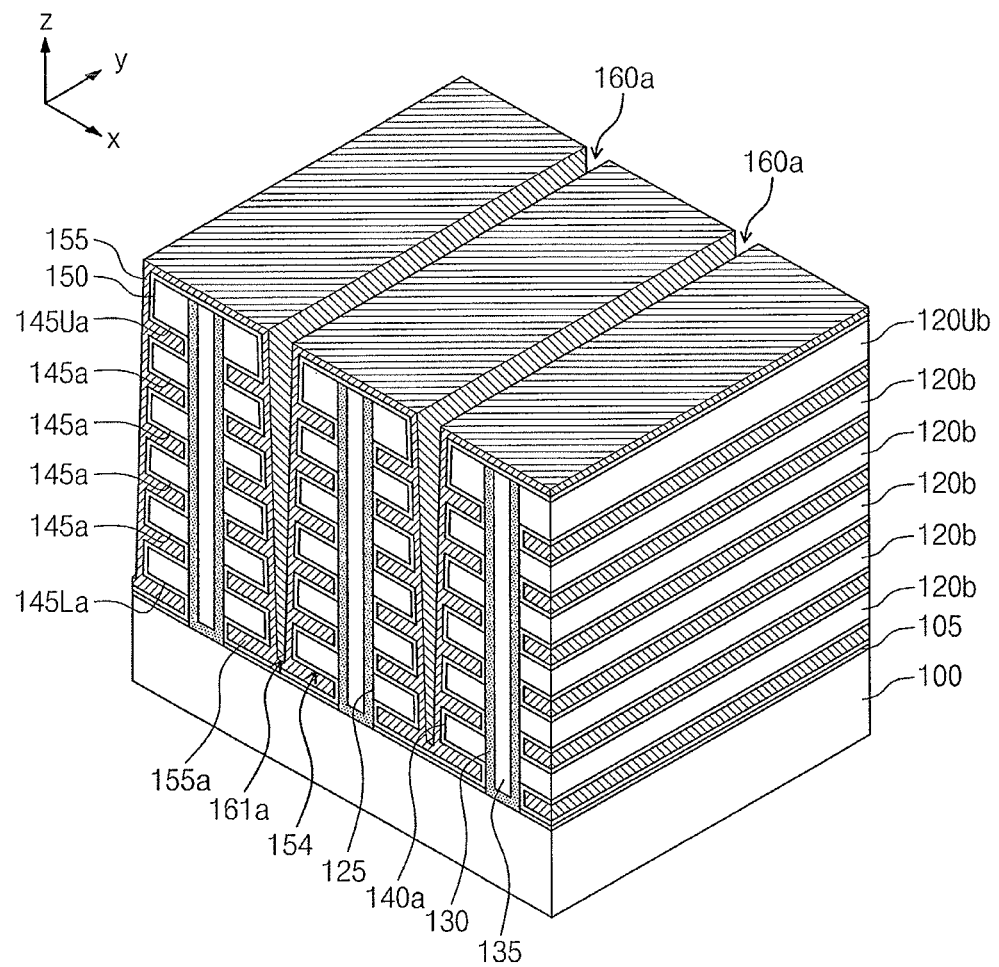

Referring to FIG. 16, the information storage layer 150 may be formed on the substrate 100 having the recess regions 145La, 145a, 145Ua, and the gate conductive layer 155 may be formed on the substrate 100 having the information storage layer 150. The gate conductive layer 155 may fill the recess regions 145La, 145a, 145Ua. At this time, an empty region 160a surrounded by the gate conductive layer 155 may be defined in the trench 140a. A bottom surface 161a and a sidewall of the empty region 160a may be defined by the gate conductive layer 155, and the empty region may have a shape opened upward. Due to the shape of the trench 140a, the sidewall of the empty region 160a may be also formed obliquely. A width of an upper end of the empty region 160a may be greater than a width of a lower end of the empty region 160a. The bottom surface 161a of the empty region 160a may be lower than the top surface 154 of the portion 155a of the gate conductive layer 155 filling the lowermost recess region 145La.

The second width W2 of the upper end of the trench 140a may be greater than the first width W1 of the lower end of the trench 140a. By doing so, gases for deposition of the gate conductive layer 155 may be more easily supplied into the trench 140a. As a result, the gate conductive layer 155 may fill the recess regions 145La, 145a, 145Ua more easily, and thickness uniformity of the gate conductive layer 155 formed outside the recess regions 145La, 145a, 145Ua and inside the trench 140a may be further enhanced.

Figure 17:
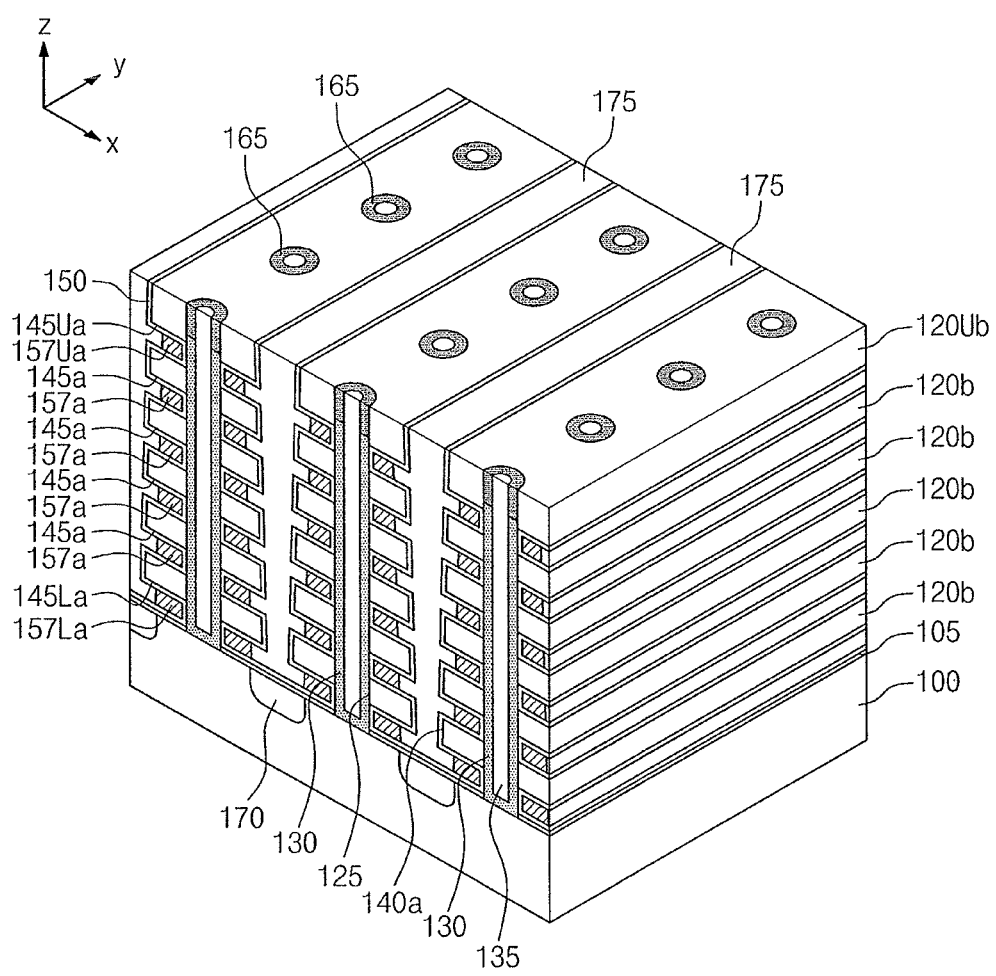

Referring to FIG. 17, an isotropic etch process may be performed with respect to the gate conductive layer 155 having the empty region 160a to form gate electrodes 157La, 157a, 157Ua in the recess regions 145La, 145a, 145Ua, respectively. The gate electrodes 1571a, 157a, 157Ua may respectively correspond to portions of the gate conductive layer 155 positioned in the recess regions 145La, 145a, 145Ua. The gate conductive layer 155 on the uppermost insulating pattern 120Ub among the insulating patterns 120b, 120Ub may also be removed by the isotropic etch process. The isotropic etch process may be performed as described previously with reference to FIG. 7.

The isotropic etch process may be performed through the empty region 160a. By doing so, the sidewall and the bottom surface 161a of the empty region 160a may be etched substantially simultaneously. In particular, since the width of the upper end of the empty region 160a is wider than the width of the bottom surface 161a of the empty region 160a, an etchant or etching gas used for performing the isotropic etch process may be supplied into the inside of the empty region 160a more easily. By doing so, the etch uniformity of the sidewall and the bottom surface 161a of the empty region 160a may be further enhanced. Resultantly, reproducibility of the gate electrodes 157La, 157a, 157Ua may be enhanced, and etch damage and/or deformation of other structures, e.g., trench shape and/or information storage layer 150, etc., may be minimized.

Since the bottom surface 161a of the empty region 160a is formed lower than the top surface 154 of the portion 155a of the gate conductive layer 155 filling the lowermost recess region 145La, the lowermost gate electrode 157La may be also separated substantially simultaneously with the gate electrodes 157a, 157Ua positioned at different heights. Among the gate electrodes 157La, 157a, 157Ua, the lowermost gate electrode 157La may correspond to a gate of a lower select transistor, and the uppermost gate electrode 157Ua may correspond to a gate of an upper select transistor. The gate electrodes 157a between the lowermost gate electrode 157La and the uppermost gate electrode 157Ua may correspond to control gates of memory cells, respectively.

The gate electrodes 157La, 157a, 157Ua may have outer sidewalls adjacent to the trench 140a, and inner sidewalls adjacent to the active pattern 130. Also, the insulating patterns 120a, 120Ua may have outer sidewalls adjacent to the trench 140a, and inner sidewalls adjacent to the active pattern 130. By the isotropic etch process, the outer sidewalls of the gate electrodes 157La, 157a, 157Ua may be recessed further laterally than the outer sidewalls of the insulating patterns 120a, 120Ua. The outer sidewalls of the gate electrodes 157La, 157a, 157Ua may be recessed toward the active pattern 130. By doing so, some portions of the recess regions 145La, 145a, 145Ua adjacent to the outer sidewalls of the gate electrodes 157L, 157, 157U may become empty. Some empty portions of the recess regions 145La, 145a, 145Ua may have a form of an undercut region.

The gate electrodes 157La, 157a, 157Ua may have different widths due to the shape of the recess regions 1451a, 145a, 145Ua and the isotropic etch process through the empty region 160a. In other words, the width of the lowermost gate electrode 157La may be greater than the width of the uppermost gate electrode 157Ua. Also, a width of the gate electrode positioned at a relatively low level among the gate electrodes 157La, 157a, 157Ua may be greater than a width of the gate electrodes positioned at a high level.

Figure 18:
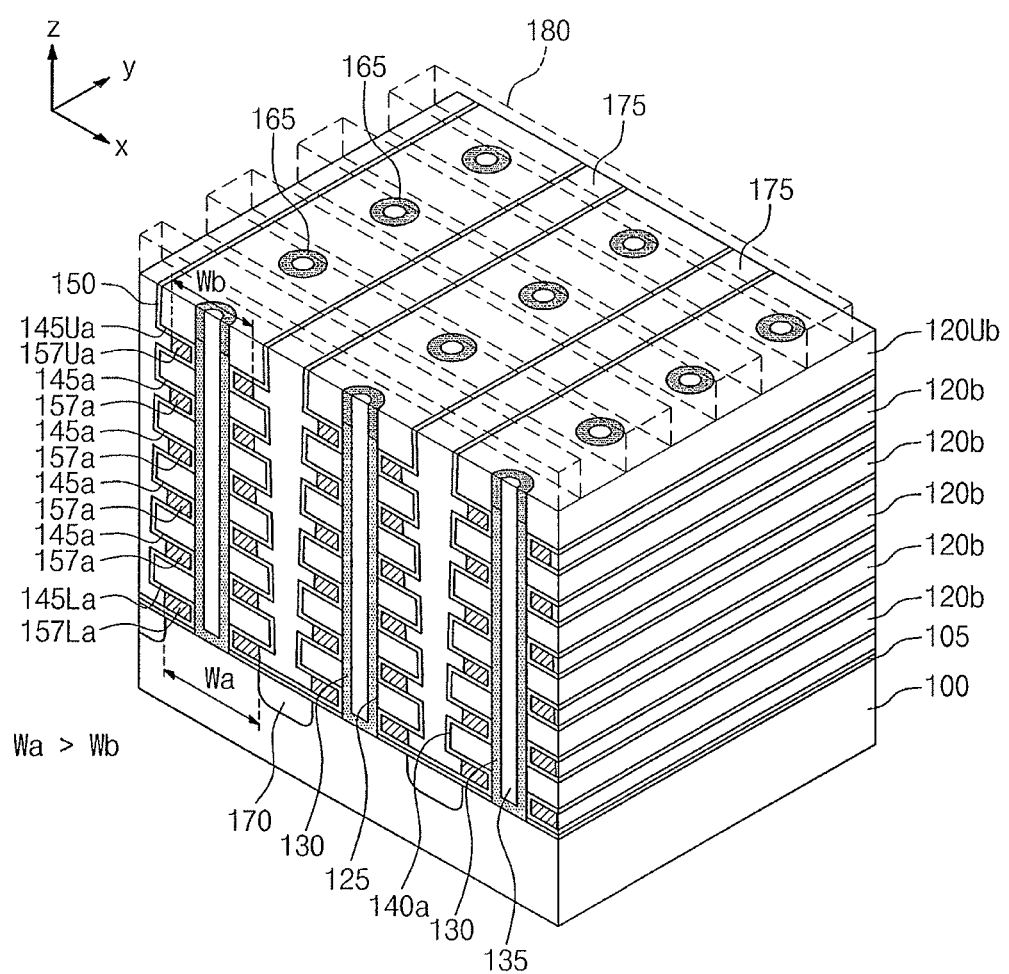
FIG. 18 illustrates a perspective view of a three-dimensional semiconductor memory device according to another embodiment.

The common source region 170 may be formed in the substrate 100 below the trench 140a. The drain region 165 may be formed in an upper portion of the active pattern 130. The common source region 170 and the drain region 165 may be formed by using the same methods as the methods described previously with reference to FIG. 8. The device isolation pattern 175 filling the trench 140a may be formed. The device isolation pattern 175 may fill empty portions of the recess regions 145La, 145a, 145Ua, i.e., empty portions due to the outer sidewalls of the gate electrodes 1571a, 157a, 157Ua being laterally recessed. The bit line 180 (FIG. 18) electrically connected with the drain region 165 may be formed. By doing so, the three-dimensional semiconductor memory device shown in FIG. 18 may be fabricated. FIG. 18 illustrates a perspective view of a three-dimensional semiconductor memory device according to another embodiment.

Referring to FIG. 18, the gate electrodes 157La, 157a, 157Ua and insulating patterns 120b, 120Ub may be alternately and repeatedly stacked on the substrate 100. The alternately and repeatedly stacked gate electrodes 157La, 157a, 157Ua and insulating patterns 120b, 120Ub may constitute a single stack structure. The stack structure may be disposed in plurality on the substrate 100, and the plurality of stack structures may be spaced apart in a first direction, i.e., the x-axis direction, parallel to the top surface of the substrate 100. The gate electrodes 157La, 157a, 157Ua and the insulating patterns 120a, 120Ua may extend in parallel in a second direction, i.e., the y-axis direction, parallel to the top surface of the substrate 100 and perpendicular to the first direction.

The device isolation pattern 175 may be disposed between the stack structures adjacent to each other. In other words, the device isolation pattern 175 may be disposed on the substrate 100 at one side of the stack structure. The active pattern 130 may penetrate the alternately and repeatedly stacked gate electrodes 157La, 157a, 157Ua and insulating patterns 120a, 120Ua. Each of the active patterns 130 may penetrate each of the stack structures. The information storage layer 150 may be disposed between a sidewall of the active pattern 130 and the gate electrodes 157La, 157a, 157Ua. The active pattern 130 may have a hollow pipe shape, a hollow cylindrical shape, a hollow macaroni shape or the like, as shown in FIG. 10. An inside of the active pattern 130 may be filled with the dielectric pattern 135. Alternatively, the active pattern 130 of FIG. 18 may be substituted for the active pattern 130a of FIG. 13. In this case, the dielectric pattern 135 may be omitted.

Each of the active patterns 130, the gate electrodes 157La, 157a, 157Ua surrounding each of the active patterns 130, and the information storage layer 150 disposed between the each of the active patterns 130 and the gate electrodes 157La, 157a, 157Ua may be included in a single vertical type cell string. The lowermost gate electrode 157La corresponds to a gate of the lower select transistor, and the uppermost gate electrode 157Ua corresponds to a gate of the upper select transistor. The gate electrodes 157a between the lowermost gate electrode 157La and the uppermost gate electrode 157Ua correspond to gates of the memory cells, respectively. The information storage layer 130 between the gate electrodes 157 and the active pattern 130 corresponds to a data storage element of the memory cell.

The gate electrodes 157La, 157a, 157Ua may have inner sidewalls adjacent to the active pattern 130, and outer sidewalls 158 adjacent to the device isolation pattern 175. Likewise, the insulating patterns 120a, 120Ua may have inner sidewalls adjacent to the active pattern 130, and outer sidewalls 122 adjacent to the device isolation patterns 175. The outer sidewalls 158 of each of the gate electrodes 157La, 157a, 157Ua may be recessed further laterally toward the active pattern 130, as compared with the outer sidewall of each of the insulating patterns 120a, 120Ua positioned, e.g., directly, on each of the gate electrodes 157La, 157a, 157Ua. The undercut region may be defined by the outer sidewall 158 of each of the gate electrodes 157La, 157a, 157Ua being recessed, and the device isolation pattern 175 may extend to fill the undercut regions.

A top surface of the lowermost gate electrode 157a may have a first width Wa in the first direction. The first width Wa may corresponds to a horizontal distance between the uppermost ends of both outer sidewalls of the lowermost gate electrode 157La. A top surface of the uppermost gate electrode 157Ua may have a second width Wb in the first direction. The second width Wb corresponds to a horizontal distance between the uppermost ends of both outer sidewalls of the uppermost gate electrode 157Ua. According to this embodiment, the first width Wa may be greater than the second width Wb, i.e., Wa>Wb. Outer sidewalls of the insulating patterns 120b, 120Ub may have an oblique shape.

The common source region 175 may be disposed in the substrate 100 below the device isolation pattern 175, and the drain region 165 may be disposed in an upper portion of the active pattern 130. The bit line 180 may be electrically connected with the drain region 165. The bit line 180 may extend in the first direction, i.e., x-axis direction. The plurality of bit lines 180 may be disposed in parallel on the substrate 100. One bit line 180 may be electrically connected with the plurality of drain regions 165, which are arranged in the first direction and formed in the plurality of active patterns 130 constituting one column.

The lower select transistor including the lowermost gate electrode 157La may include a first channel region and a second channel region disclosed in FIG. 12. The buffer dielectric 105 may be disposed between the lowermost gate electrode 157La and the substrate 100. The information storage layer 150 may extend to be disposed between the buffer dielectric 105 and the lowermost gate electrode 157La. The information storage layer 150 and the buffer dielectric 105 may be disposed between the lowermost gate electrode 157La and the substrate 100, or only the information storage layer 150 may be disposed between the lowermost gate electrode 157La and the substrate 100.

The three-dimensional semiconductor memory devices according to embodiments may be mounted in various types of semiconductor packages. Examples of packages of the three-dimensional semiconductor memory devices may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi Chip Package (MCP), Wafer-level Fabricated Package (WFP), and Wafer-level Processed Stack Package (WSP). A package in which a three-dimensional semiconductor memory according to embodiments is mounted may further include a controller for controlling the semiconductor memory device, and/or a logic device.

Figure 19:
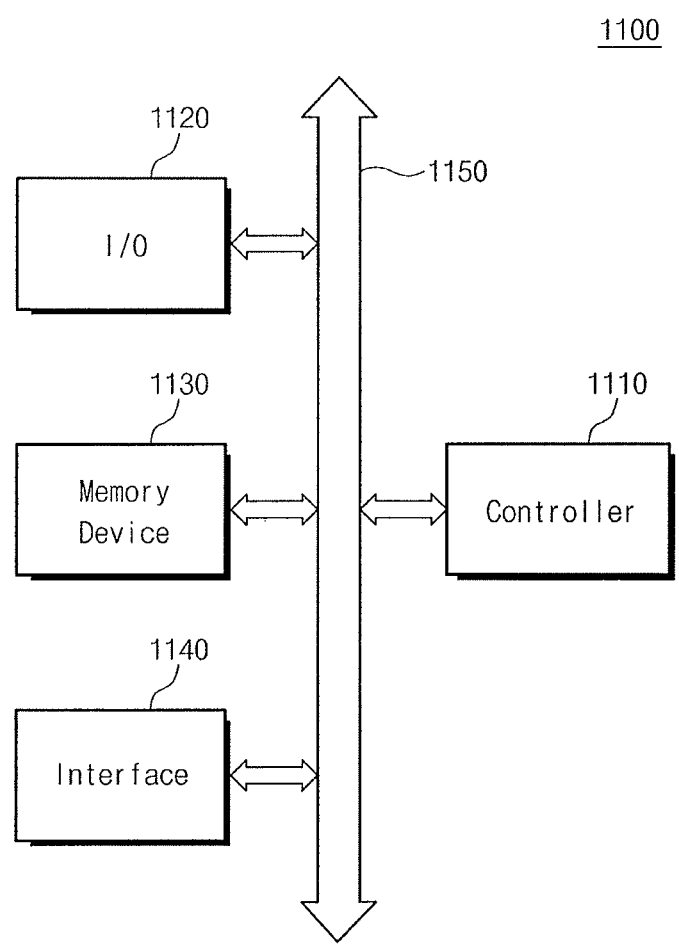
FIG. 19 illustrates an exemplary block diagram of an electronic system including a semiconductor memory device according to an embodiment.

FIG. 19 illustrates an exemplary block diagram of an electronic system including a semiconductor memory device according to an embodiment. Referring to FIG. 19, an electronic system 1100 may include a controller 1110, an input/output device (I/O) 1120, a memory device 1130, an interface 1140, and a bus 1150. The controller 1110, the input/output device 1120, the memory device 1130 and/or the interface 1140 may be coupled to one another through the bus 1150. The bus 1150 corresponds to a path through which data is moved.

The controller 1110 may include at least one of a microprocessor, a digital signal processor, a microcontroller, and logic devices capable of performing similar functions to the above elements. The input/output device 1120 may include a keypad, a keyboard, a display device and the like. The memory device 1130 may store data and/or commands. The memory device 1130 may include a three-dimensional semiconductor memory device according to example embodiments. Also, the memory device 1130 may further include other types of semiconductor devices, e.g., DRAM device and/or SRAM device. The interface 1140 may serve to transmit/receive data to/from a communication network. The interface 1140 may include a wired and/or wireless interface. For example, the interface 1140 may include an antenna and/or a wired/wireless transceiver. Although not shown in the drawings, the electronic system 1100 may further include a high speed DRAM and/or SRAM as a working memory for enhancing operations of the controller 1110.

The electronic system 1100 may be applied to a personal digital assistant (PDA), a portable computer, a web tablet, a wireless phone, a mobile phone, a digital music player, or all electronic products capable of transmitting/receiving information in a wireless environment.

Figure 20:
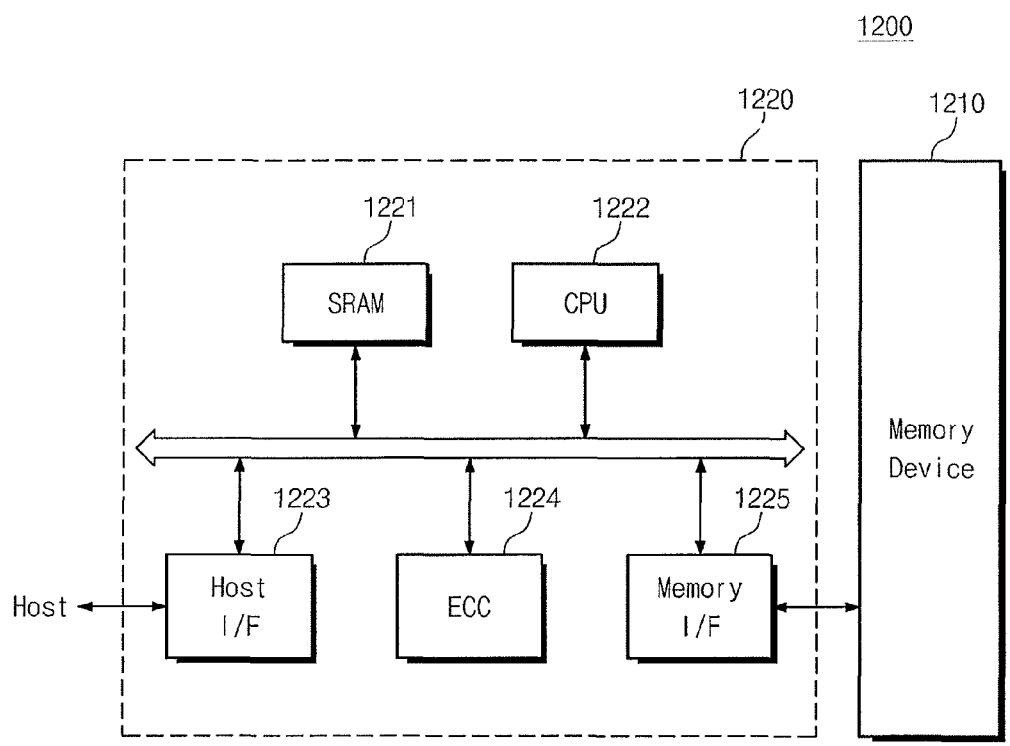
FIG. 20 illustrates a block diagram of a memory card including a semiconductor memory device according to an embodiment.

FIG. 20 illustrates a block diagram of a memory card including a semiconductor memory device according to example embodiments. Referring to FIG. 20, a memory card 1200 according to an embodiment may include a memory device 1210. The memory device 1210 may include a three-dimensional semiconductor memory device according to example embodiments. Also, the memory device 1210 may further include other types of semiconductor memory devices, e.g., DRAM device and/or SRAM device. The memory card 1200 may include a memory controller for controlling data exchange between a host and the memory device 1210.

The memory controller 1220 may include a processing unit (CPU) 1222 controlling an overall operation of the memory card 1200. Also, the memory controller 1220 may include a SRAM 1221 used as a working memory of the processing unit 1222. In addition, the memory controller 1220 may further include a host interface 1223 and a memory interface 1225.

The host interface 1223 may be provided with a data exchange protocol between the memory card 1200 and the host. The memory interface 1225 may connect the memory controller 1220 and the memory device 1210. Furthermore, the memory controller 1220 may further include an error correction block (ECC) 1224. The ECC 1224 may detect and correct an error of data read from the memory device 1210. Although not shown in FIG. 20, the memory card 1200 may further include a ROM device storing code data for interfacing with the host. The memory card 1200 may be used as a portable data storage card. Alternatively, the memory card 1200 may be provided in the form of a solid state disk (SSD) that can substitute for a hard disk of a computer system.

As described above, according to embodiments, when the gate conductive layer filling the recess regions is formed, an empty region surrounded by the gate conductive layer may be defined in the trench. The gate conductive layer having the empty region may be etched by using an isotropic etch process to form the gate electrodes. As the isotropic etch process is performed through the empty region, the gate conductive layer constituting the bottom surface and sidewall of the empty region may be etched substantially simultaneously. As a result, gate electrodes may be separated substantially simultaneously. By doing so, damages, e.g., damage of information storage layer and/or deformation of trench), of other structures may be minimized, so that a three-dimensional semiconductor memory device optimized for higher integration and having superior reliability may be fabricated.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor memory device, comprising:
    alternately and repeatedly stacking sacrificial layers and insulating layers on a substrate;
    forming an active pattern on the substrate, such that the active pattern penetrates the sacrificial layers and the insulating layers;
    continuously patterning the insulating layers and the sacrificial layers to form a trench;
    removing the sacrificial layers exposed in the trench to form recess regions, such that the recess regions expose a sidewall of the active pattern;
    forming a blocking insulating layer on the substrate;
    depositing a gate conductive layer on the blocking insulating layer, such that the deposited gate conductive layer completely fills the recess regions and defines an empty region in the trench, the empty region being surrounded by the gate conductive layer; and
    performing an isotropic etch process with respect to the deposited gate conductive layer to form gate electrodes in the recess regions, such that the gate electrodes are separated from each other.

2. The method as claimed in claim 1, wherein depositing the gate conductive layer to define the empty region in the trench includes defining a bottom surface of the empty region by the gate conductive layer, such that the bottom surface of the empty region is lower than a top surface of a portion of the gate conductive layer filling a lowermost recess region among the recess regions.

3. The method as claimed in claim 1, wherein forming the gate electrodes in the recess regions includes recessing sidewalls of the gate electrodes adjacent to the trench further laterally than sidewalls of the patterned insulating layers adjacent to the trench by the isotropic etch process.

4. The method as claimed in claim 3, further comprising forming a device isolation pattern filling the trench and portions of the recess regions adjacent to the gate electrodes.

5. The method as claimed in claim 1, wherein patterning the insulating layers and the sacrificial layers to form a trench includes forming the trench with an oblique sidewall, such that a width of a lower end of the trench is smaller than a width of an upper end of the trench.

6. The method as claimed in claim 5, wherein forming the gate electrodes includes forming a width of an uppermost gate electrode among the gate electrodes smaller than a width of a lowermost gate electrode.

7. The method as claimed in claim 1, wherein forming the active pattern includes:
   forming a channel opening penetrating the insulating layers and the sacrificial layers to expose the substrate; and
   forming the active pattern in the channel opening, such that the trench is spaced apart laterally from the channel opening.

8. The method as claimed in claim 7, wherein forming the active pattern in the channel opening includes:
   conformally forming an active layer on the substrate having the channel opening;
   forming a dielectric on the active layer to fill the channel opening; and
   removing portions of the dielectric and the active layer outside the channel opening.

9. A method of fabricating a semiconductor memory device, comprising:
   alternately and repeatedly stacking sacrificial layers and insulating layers on a substrate;
   forming an active pattern on the substrate, such that the active pattern penetrates the sacrificial layers and the insulating layers;
   continuously patterning the insulating layers and the sacrificial layers to form a trench;
   removing the sacrificial layers exposed in the trench to form recess regions, such that the recess regions expose a sidewall of the active pattern;
   forming a blocking insulating layer on the substrate;
   forming a gate conductive layer on the blocking insulating layer, such that the gate conductive layer fills the recess regions and defines an empty region in the trench, the empty region being surrounded by the gate conductive layer; and
   performing an isotropic etch process with respect to the gate conductive layer to form gate electrodes in the recess regions such that the gate electrodes are separated from each other, forming the gate electrodes in the recess regions including recessing sidewalls of the gate electrodes adjacent to the trench further laterally than sidewalls of the patterned insulating layers adjacent to the trench by the isotropic etch process.

10. The method as claimed in claim 9, further comprising forming a device isolation pattern filling the trench and portions of the recess regions adjacent to the gate electrodes.

11. A method of fabricating a semiconductor memory device, comprising:
   alternately and repeatedly stacking sacrificial layers and insulating layers on a substrate;
   forming an active pattern on the substrate, such that the active pattern penetrates the sacrificial layers and the insulating layers;
   continuously patterning the insulating layers and the sacrificial layers to form a trench, the trench being formed with an oblique sidewall such that a width of a lower end of the trench is smaller than a width of an upper end of the trench;
   removing the sacrificial layers exposed in the trench to form recess regions, such that the recess regions expose a sidewall of the active pattern;
   forming a blocking insulating layer on the substrate;
   forming a gate conductive layer on the blocking insulating layer, such that the gate conductive layer fills the recess regions and defines an empty region in the trench, the empty region being surrounded by the gate conductive layer; and
   performing an isotropic etch process with respect to the gate conductive layer to form gate electrodes in the recess regions such that the gate electrodes are separated from each other, forming the gate electrodes including forming a width of an uppermost gate electrode among the gate electrodes smaller than a width of a lowermost gate electrode.

12. The method as claimed in claim 11, wherein forming the gate conductive layer to define the empty region in the trench includes defining a bottom surface of the empty region by the gate conductive layer, such that the bottom surface of the empty region is lower than a top surface of a portion of the gate conductive.

13. The method as claimed in claim 11, wherein forming the gate electrodes in the recess regions includes recessing sidewalls of the gate electrodes adjacent to the trench further laterally than sidewalls of the patterned insulating layers adjacent to the trench by the isotropic etch process.

* * * * *

UNITED STATES PATENT AND TRADEMARK OFFICE
CERTIFICATE OF CORRECTION

| | | |
|---|---|---|
| PATENT NO. | : 8,728,893 B2 | Page 1 of 1 |
| APPLICATION NO. | : 13/775453 | |
| DATED | : May 20, 2014 | |
| INVENTOR(S) | : Byoungkeun Son et al. | |

It is certified that error appears in the above-identified patent and that said Letters Patent is hereby corrected as shown below:

On the Title Page of the Patent, Item (54) and in the Specification, column 1, line 1, Title should read:

-- METHOD OF FABRICATING A THREE- DIMENSIONAL SEMICONDUCTOR MEMORY DEVICE --

Signed and Sealed this
Eighth Day of July, 2014

Michelle K. Lee
*Deputy Director of the United States Patent and Trademark Office*